(12) United States Patent
Yamashita et al.

(10) Patent No.: US 7,588,835 B2
(45) Date of Patent: Sep. 15, 2009

(54) METHOD OF TREATING THE SURFACE OF COPPER AND COPPER

(75) Inventors: Tomoaki Yamashita, Oyama (JP); Yasuo Inoue, Chikusei (JP); Masaharu Matsuura, Yuuki (JP); Toyoki Ito, Chikusei (JP); Akira Shimizu, Yuuki (JP); Fumio Inoue, Tsukuba (JP); Akishi Nakaso, Oyama (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 11/908,329

(22) PCT Filed: Mar. 10, 2006

(86) PCT No.: PCT/JP2006/304728

§ 371 (c)(1),
(2), (4) Date: Sep. 11, 2007

(87) PCT Pub. No.: WO2006/095851

PCT Pub. Date: Sep. 14, 2006

(65) Prior Publication Data

US 2008/0096046 A1    Apr. 24, 2008

(30) Foreign Application Priority Data

Mar. 11, 2005  (JP) ............................. 2005-069058
Sep. 26, 2005  (JP) ............................. 2005-277732
Sep. 30, 2005  (JP) ............................. 2005-287038

(51) Int. Cl.
*B32B 15/20* (2006.01)
*C23C 22/78* (2006.01)
*C23C 22/63* (2006.01)
*C23C 22/83* (2006.01)

(52) U.S. Cl. .................. 428/607; 428/670; 428/674; 428/687; 428/209; 148/277; 427/331; 427/287

(58) Field of Classification Search ............... 428/674, 428/687, 220, 332; 148/432, 282, 243, 240
See application file for complete search history.

(56) References Cited

U.S. PATENT DOCUMENTS 4,902,551 A    2/1990    Nakaso et al.

(Continued)

FOREIGN PATENT DOCUMENTS

EP    0 726 697 A2    8/1996

(Continued)

OTHER PUBLICATIONS

Korean Official Action for Application No. 10-2007-7023145, dated Feb. 12, 2008.

(Continued)

*Primary Examiner*—John J Zimmerman
(74) *Attorney, Agent, or Firm*—Antonelli, Terry, Stout & Kraus, LLP.

(57) ABSTRACT

A method of treating the surface of copper is provided to ensure adhesive strength between the surface of copper and an insulating layer without forming irregularities exceeding 1 μm on the surface of copper and to improve insulation reliability between wirings. A copper whose surface is treated by the above surface treating method is also provided. The method of treating the surface of copper comprises the surface of copper comprising the steps of: forming a metal nobler than copper discretely on the surface of copper; and subsequently oxidizing the surface of copper by using an alkaline solution containing an oxidant.

18 Claims, 8 Drawing Sheets

U.S. PATENT DOCUMENTS

| | | | | |
|---|---|---|---|---|
| 5,252,355 | A | * | 10/1993 | Ando et al. .................. 216/20 |
| 7,479,305 | B2 | * | 1/2009 | Schreier et al. ............ 427/436 |
| 2003/0207145 | A1 | | 11/2003 | Anderson et al. |
| 2004/0209109 | A1 | | 10/2004 | Tsuchida et al. |

FOREIGN PATENT DOCUMENTS

| | | | |
|---|---|---|---|
| EP | 0 926 263 | A2 | 6/1999 |
| EP | 0 926 265 | A1 | 6/1999 |
| GB | 2294476 | A | 5/1996 |
| JP | 01-156479 | | 6/1989 |
| JP | 4-159797 | * | 6/1992 |
| JP | 7-13304 | | 2/1995 |
| JP | 2656622 | | 5/1997 |
| JP | 09-246720 | | 9/1997 |
| JP | 2000-282265 | | 10/2000 |
| JP | 2002-030481 | * | 1/2002 |
| JP | 2002-164390 | | 6/2002 |
| JP | 2003-201585 | | 7/2003 |
| WO | WO 93/10277 | * | 5/1993 |

OTHER PUBLICATIONS

Notification of Reason for Refusal; JP 2005-069058; Dispatch Date: Feb. 14, 2006.

Decision for Rejection; JP 2005-069058; Dispatch Oct. 3, 2006.

Supplementary European Search Report dated Sep. 25, 2008, for Application No. EP 06 72 8896.

Korean Official Action for Application No. 10-2007-7023145, dated May 19, 2008.

* cited by examiner 1 0 6

METHOD OF TREATING THE SURFACE OF COPPER AND COPPER

FIELD OF THE INVENTION

The present invention relates to a method of treating the surface of copper and to copper which is surface-treated by the surface treating method.

BACKGROUND ART

The recent information-oriented society has been remarkably developed. Along with this, small-sized, light-weight, high performance and high functional devices such as personal computers and portable telephones for public use are being developed and there is also a current need for an improvement in radio base stations, optical communication devices and relevant network devices such as servers and routers for industrial use irrespective of size. And, with an increase in the amount of information to be transferred, frequency of signals to be handled are becoming higher year by year and developments in high-speed processing and high-speed transfer technologies are being made. With regard to the packaging concerned, system-on-chip (SoC), system-in-package (SiP) and the like are being developed as new high-density packaging technologies in addition to the developments of high-speed and highly functional CPUs, DSPs and LSIs such as various memories. For this, as to substrates for mounted with semiconductor chips and mother boards, multilayer wiring boards on which fine wires (L/S; line/space of 30 μm/30 μm or less) are formed by buildup method have come to be used to cope with higher frequency, higher density wiring and higher functionality.

A substrate formed with fine wiring is obtained by forming the wiring by a subtractive method or a semi-additive method.

In a general process of forming the wiring using a subtractive method, an etching resist is formed on the surface of copper and then subjected to exposure to light and developed to form a resist pattern. Next, unnecessary copper is etched and the resist is peeled off to form the wiring.

In a general process of forming the wiring using a semi-additive method, a plating resist is formed on the surface of copper (seed layer) and then subjected to exposure to light and developed to form a resist pattern. Next, electroplating, peeling off the resist and etching are carried out to form the wiring.

Also, after the wiring is formed, a solder resist or a cover lay may be formed on the wiring to protect the wiring other than external connecting terminals, semiconductor chip connecting terminals and the like. In order to adjust the wiring size to those having a designed L/S width, it is necessary to form a resist pattern according to the design. However, there is the problem that in the formation of fine wiring having L/S of 30 μm/30 μm or less, it is difficult to obtain accuracy of a resist pattern by the influence of halation caused by the reflection of light on the shiny surface of copper when the resist is exposed to light.

Also, there is the problem that the adhesion between the surface of copper and the resist pattern is reduced with the result that the resist pattern is peeled off. There is also the problem that the adhesion between the wiring (copper) and the solder resist and between the wiring and the cover lay, on the other hand, is insufficiently obtained as the wiring is more fined. In order to solve these problems, it is therefore important to minimize the amount of dissolving copper when mat the surface of copper is treating to mat the copper surface for and to strengthen the adhesion between the surface of copper and the resist.

On the other hand, a buildup method multilayer wiring board is manufactured by repeatedly carrying out a layer insulating layer forming process and a wiring forming process alternately. In this production method, it is important to secure the adhesive strength between the wiring and an insulating resin and insulation reliability between the wires.

In order to satisfy the above characteristics (or demand), a method of treating the surface of copper as shown below is carried out conventionally.

Specifically, in this method, a rough shape of the order of micron is imparted to the surface of copper to mat the surface of copper and further, the adhesions between the surface of copper and the resist (for etching or soldering) and between the surface of copper and the insulating resin are obtained by an anchoring effect. Examples of the matting method include a method in which a rough shape of the order of micron is imparted to the surface of copper by using an aqueous solution containing a major agent containing an inorganic acid and a copper oxidant and an adjuvant agent containing at least one of azoles and at least one etching inhibitor (Japanese Patent Application Laid-Open No. 2000-282265) and a method in which continuous irregularities 1.5 to 5.0 μm in height are formed by micro etching and then chromate treatment and coupling agent treatment are carried out (Japanese Patent Application Laid-Open No. 9-246720).

There is also a method in which fine copper oxide needle crystals are provided to the surface of copper to form irregularities, thereby matting the surface of copper and obtaining the adhesion between the surface of copper and the resist or the insulating resin by an anchoring effect. There is, for example, a method in which the substrate is dipped at around 80° C. in an aqueous alkaline solution containing an oxidant such as sodium chlorite to form fine copper oxide needle crystals (Japanese Patent Application Publication No. 7-13304).

There is, besides the above methods, a method in which reducing treatment is carried out after irregularities are formed on the surface of copper by providing fine copper oxide needle crystals to the surface of copper to mat the surface of copper and also to obtain the adhesion between the surface of copper and the resist or the insulating resin by an anchoring effect. Examples of this method include a method in which the substrate is dipped at around 80° C. in an aqueous alkaline solution containing an oxidant such as sodium chlorite to provide fine needle crystals of copper oxide, and then the substrate is subjected to reducing treatment using an acidic solution prepared by mixing at least one of amineboranes with a boron type chemical to provide fine needle crystals of metal copper (Japanese Patent No. 2656622).

DISCLOSURE OF THE INVENTION

In the foregoing first prior technologies in which a rough shape of the order of micron is provided to the surface of copper to improve the adhesive strength of the surface of copper to the resist or the insulating resin, irregularities having a Rz of 1.5 to 5 μm are formed to secure the adhesive strength by an anchoring effect. However, in the formation of fine wiring, it is difficult to remove the resist perfectly from the surface of copper in the developing process if L/S is narrow and the irregularities of the interface of copper stuck to the resist have a rough shape exceeding 1 μm, giving rise to the problem that short circuits between the wires happen in the subsequent etching treatment. On the same score, and the adhesion between the surface of copper and the insulating resin or the solder resist is not obtained afterward by this residue of resist. Besides the above problems, there is the problem that non-plating and plating unevenness are caused when the surface of external connecting terminals and the like are plated with gold.

Also, in the formation of fine wiring by using a semi-additive method, the film thickness of a copper seed layer is thin and particularly the film thickness of a copper seed layer formed by sputtering is 0.1 μm to 1.0 μm, giving rise to the problem that no irregularities can be formed on this surface of copper.

Moreover, such a rough shape that the surface of the wiring has irregularities exceeding 1 μm brings about the result that when high speed electric signals are made to pass through such wiring, the flow of the electric signals is eventually concentrated on the vicinity of the surface of the wiring by the skin effect, giving rise to the problem that a transfer loss is increased. In the case of finer wiring having a L/S of less than 25 μm/25 μm, there is the problem that the wiring is fined and a variation in wiring width is increased.

In the foregoing second prior technologies in which fine needle crystals of copper oxide are provided to the surface of copper to improve the adhesive strength of the surface of copper to the resist or the insulating resin, irregularities having a Rz (10 points average roughness) of 0.1 to 1.5 μm are formed on the surface of the wiring to secure the adhesive strength by an anchoring effect in the same manner as in the first prior technologies. However, in the formation of fine wiring, if the irregularities on the surface of copper stuck to the resist have a needle shape, there are the problems, caused by the residual resist like the above that short circuits between the wires, the adhesion between the surface of copper and the insulating resin or the solder resist is not obtained, and non-deposition of gold plating or gold plating unevenness are caused.

Also, in the formation of fine wiring by using a semi-additive method, irregularities can be formed on a copper seed layer formed by sputtering or the like. However, because a resist cannot be removed completely from the surface of copper as mentioned above, there are the problems that it is difficult to form the wiring on the seed layer, short circuits are developed between the wires, the adhesion between the surface of copper and the insulating resin or the solder resist is not obtained, and non-deposition of gold plating or gold plating unevenness are caused.

Moreover, the variation in the height of the irregularities is large and when Rz<0.5 μm, there is the problem that reliability of the adhesion under high temperature and high humidity condition is reduced whereas when Rz>1.0 μm, there is the problem that the transfer loss is increased in the same manner as in the first prior technologies. Also, because needle crystals of copper oxide are easily broken, and flat line treatment cannot be performed, posing a problem concerning deteriorated operability when a thin plate is treated. Moreover, in a plating process for connecting a through-hole, the needle crystals of copper oxide are dissolved whereby a pink color ring (pink ring) is generated in the vicinity of the through-hole with the result that the reliability to insulation is easily deteriorated and the surface of copper is easily peeled from the insulating resin. Also, since a high-temperature aqueous alkaline solution is used, the surface of the insulating resin is easily affected and the reliability to insulation tends to be reduced by ionic contamination or a deterioration in insulation. In addition, there is the problem that in the washing with water after oxidation treatment, the space between needle crystals can be insufficiently washed with water because of complicated needle crystal irregularities of copper oxide and the reliability to insulation is therefore easily reduced by residual ions present between crystals.

In the foregoing third prior technologies in which fine needle crystals of copper oxide are provided to the surface of copper to improve the adhesive strength of the surface of copper to the resist or the insulating resin, the needle crystals of metal copper are not dissolved in the plating process for the connection of a through-hole and therefore, no pink ring is generated. However, the third prior technologies have the same problems as in the second prior technologies: namely, in the formation of fine wiring, short circuits are occurred between the wirings, the adhesion between the surface of copper and the insulating resin or the solder resist is not obtained, and non-deposition of gold plating or gold plating unevenness are caused, these problems being caused by the residual resist like the above, and also problems concerning a reduction in reliability to insulation under high-temperature and high-humidity conditions, a transfer loss, operability in the treatment of a thin plate, a reduction in the reliability to insulation due to ionic contamination of insulating materials or a deterioration in insulation and a reduction in the reliability to insulation based on water-washing ability after redox treatment.

It is an object of the present invention, which is made to improve the above prior art problems, to provide a method of treating the surface of copper, the method securing the adhesive strength between the surface of copper and a resist or an insulating resin without forming irregularities exceeding 1000 nm on the surface of copper, ensuring that various kinds of reliability can be improved and also to provide copper whose surface is treated by the above surface treating method.

Accordingly, the present invention relates to the following embodiments (1) to (12).

(1) A method of treating the surface of copper, the method comprising a step of forming a metal nobler than copper discretely on the surface of copper and subsequently a step of oxidizing the above surface of copper by using an alkaline solution containing an oxidant.

(2) The method of treating the surface of copper according to the above (1), further comprising a step of carrying out one or more treatments selected from the group consisting of reducing treatment, coupling treatment and corrosion inhibitive treatment after the step of oxidizing the surface of copper.

(3) The method of treating the surface of copper according to the above (1) or (2), wherein the above oxidant is one or more selected from the group consisting of a chlorate, a chlorite, a hypochlorite, a perchlorate and a peroxodisulfate.

(4) The method of treating the surface of copper according to any one of the above (1) to (3), wherein the above metal nobler than copper is a metal selected from the group consisting of gold, silver, platinum, palladium, rhodium, rhenium, ruthenium, osmium and iridium or an alloy containing the above metal.

(5) The method of treating the surface of copper according to any one of the above (1) to (4), wherein the amount of the metal nobler than copper, formed on the surface of copper, is 0.001 μmol/dm$^2$ or more and 40 μmol/dm$^2$ or less.

(6) The method of treating the surface of copper according to any one of the above (1) to (5), wherein the roughness Rz of the above surface of copper after treated is 1 nm or more and 1000 nm or less.

(7) A copper obtained by the steps comprising a step of forming a metal nobler than copper discretely on the surface of copper and then a step of oxidizing the surface of copper by using an alkaline solution containing an oxidant.

(8) The copper according to the above (7), wherein the steps further comprises, after the step of oxidizing, a step of carrying out one or more treatments selected from the group consisting of reducing treatment, coupling treatment and corrosion inhibitive treatment.

(9) The copper according to the above (7) or (8), wherein the above oxidant is one or more selected from the group consisting of a chlorate, a chlorite, a hypochlorite, a perchlorate and a peroxodisulfate.

(10) The copper according to any one of the above (7) to (9), wherein the above metal nobler than copper is a metal selected from the group consisting of gold, silver, platinum, palladium, rhodium, rhenium, ruthenium, osmium and iridium or an alloy containing the above metal.

(11) The copper according to any one of the above (7) to (10), wherein the amount of the above metal nobler than copper, formed on the surface of copper, is 0.001 $\mu$mol/dm$^2$ or more and 40 $\mu$mol/dm$^2$ or less.

(12) The copper according to any one of the above (7) to (11), wherein the roughness Rz of the above surface of copper after treated is 1 nm or more and 1000 nm or less.

According to the present invention as mentioned above, it is possible to provide a method of treating the surface of copper, the method securing the adhesive strength between the surface of copper and a resist or an insulating resin without forming irregularities exceeding 1000 nm on the surface of copper, ensuring that various kinds of reliability can be improved and also to provide copper whose surface is treated by the above surface treating method.

It is to be noted that this patent application is accompanied by a virtue of right of priority based on Japanese Patent Applications filed previously, that is, Application No. 2005-069058 (filed on Mar. 11, 2005), No. 2005-277732 (filed on Sep. 26, 2005) and No. 2005-287038 (filed on Sep. 30, 2005) and each specification of these patent applications is incorporated as a reference into the specification of this patent application.

BRIEF DESCRIPTION OF THE INVENTION

FIG. 1 is a sectional view of a substrate for mounting a semiconductor chip to which an embodiment of the present invention is applied.

FIGS. 2(a) to 2(g) are a process diagram showing one embodiment of a manufacturing method of a substrate for mounting a semiconductor chip according to the present invention.

Figure 9:
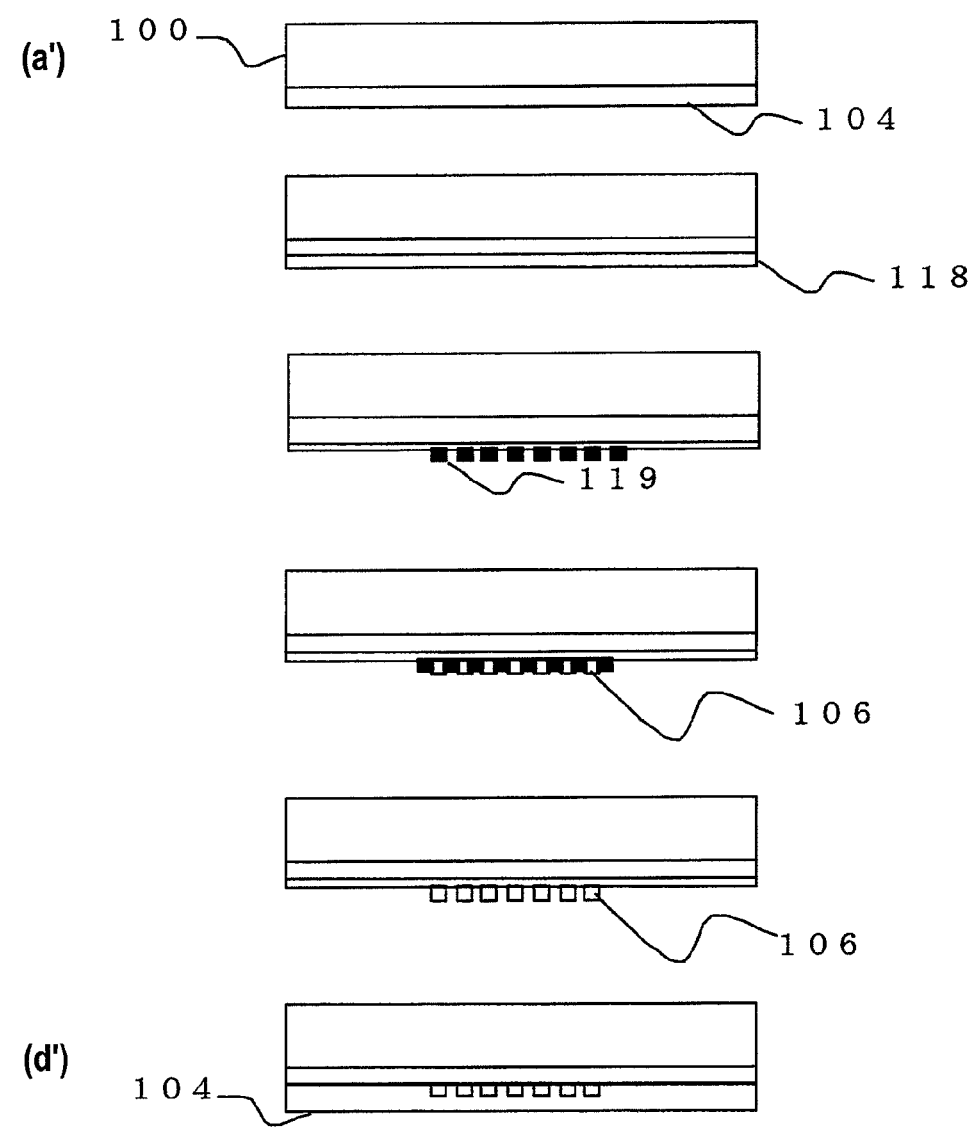

FIGS. 9(a') to 9(d') are a process diagram showing one embodiment of a manufacturing method of an evaluation substrate for test according to the present invention.

Figure 10:
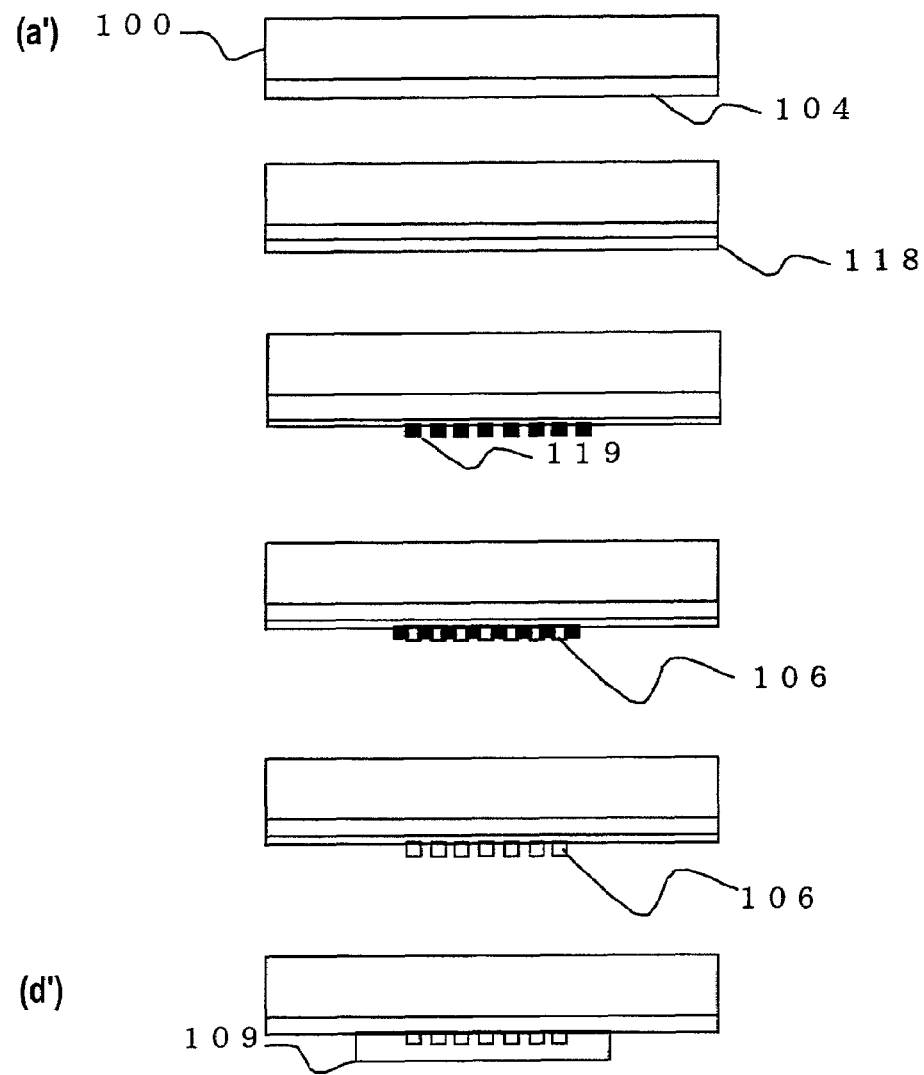

FIGS. 10 (a') to 10 (d') are a process diagram showing one embodiment of a manufacturing method of an evaluation substrate for test according to the present invention.

Figure 11:
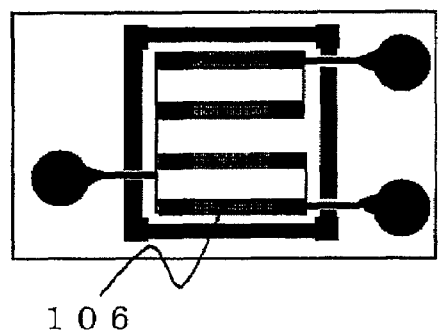

FIG. 11 is a plan view of an evaluation substrate for electrical corrosion test to which one embodiment according to the present invention is applied.

Figure 12:
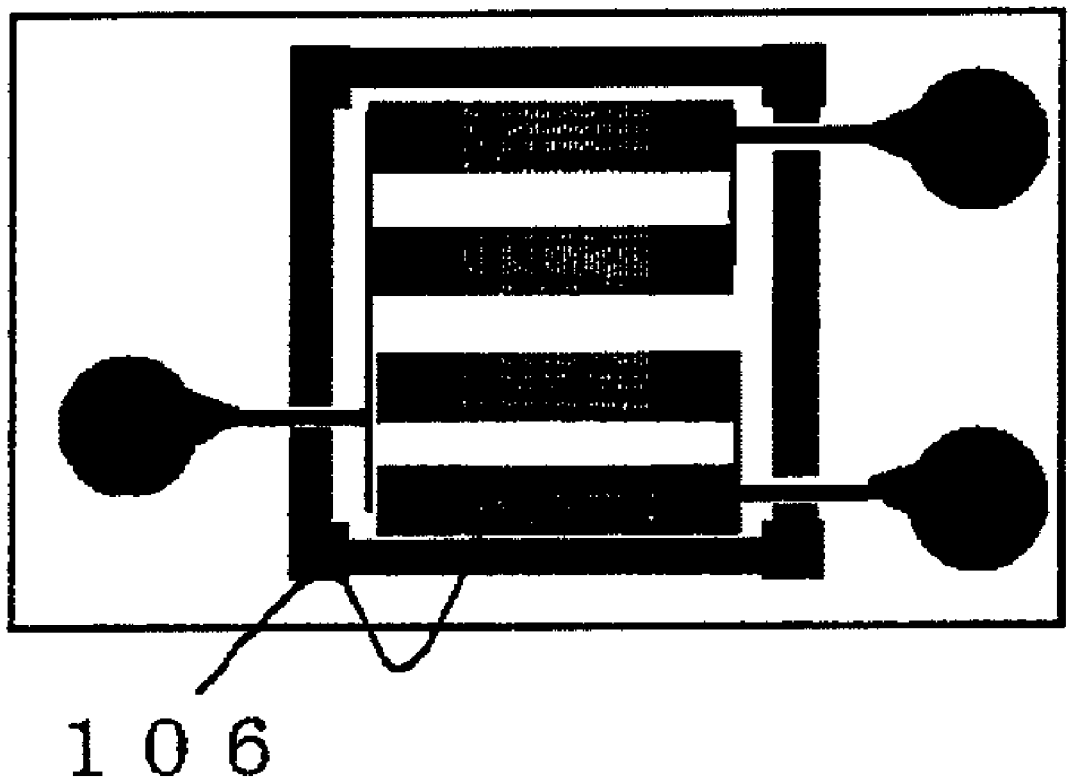

FIG. 12 is a plan view of an evaluation substrate for electrical corrosion test to which one embodiment according to the present invention is applied.

BEST MODE FOR CARRYING OUT THE INVENTION

An embodiment according to the present invention will be explained with reference to the drawings. Here, surface treatment of the copper wiring on a substrate for mounting a semiconductor chip as one example to which the method of treating the surface of copper according to the present invention is applied. However, the method according to the present invention may be likewise applied in other case of treating the surface of copper.

(Method of Forming Irregularities on the Surface of Copper)

A metal nobler than copper is formed discretely on the surface of copper, and then the surface of copper is oxidized by an alkaline solution containing an oxidant, whereby fine irregularities formed of precise and uniform copper oxide crystals can be formed on the surface of copper. Also, if reducing treatment is carried out after the above oxidation treatment, fine irregularities formed of precise and uniform metal copper crystals can be formed. Moreover, after the above oxidation treatment, it is preferable to carry out at least one or more treatments among coupling treatment and corrosion inhibitive treatment. After the above oxidation treatment, the above reducing treatment, the above coupling treatment or the above corrosion inhibitive treatment, the surface roughness Rz (10 points average roughness) of copper obtained by these surface treatments of copper is preferably 1 nm or more and 1000 nm or less. The surface roughness Rz is more preferably 1 nm or more and 100 nm or less and even more preferably 1 nm or more and 50 nm or less. When Rz is less than 1 nm, the adhesion to a resist or an insulating resin tends to drop whereas when Rz exceeds 1,000 nm, this tends to give rise to the prior art problem. In this case, the term "precise and uniform" means that when the shape of the surface of copper is processed by a scanning type electron microscope (SEM) or a focusing ion beam processing observation device (FIB) and observed using a scanning ion microscope (SIM) image, crystals of copper oxide or metal copper are formed such that the size and height of these crystals are 1 nm or more and 1,000 nm or less and the crystals are densely formed.

Hereinafter, each of the above treatments will be explained in detail. Additionally, as pretreatment of each treatment, defatting treatment, acid cleaning or a combination of these treatments for cleaning the surface of copper are preferably carried out in the present invention.

(Method of Forming a Metal Nobler than Copper)

As a method of forming a metal nobler than copper discretely on the surface of copper, it is preferable to form a metal nobler than copper in such a manner as to discrete the metal uniformly on the surface of copper without completely coating the surface of substrate copper by with reducing agent of substitutional method, electroplating, substitution plating, spray atomization, coating, sputtering or vapor deposition, though no particular limitation is imposed on this method. A method of forming a metal nobler than copper discretely on the surface of copper by substitution plating is more preferable. The substitution plating is a method utilizing a difference in ionization tendency between copper and a metal nobler than copper. According to this plating, the metal nobler than copper can be discretely formed on the surface of copper easily and inexpensively.

As the metal nobler than copper, a metal selected from gold, silver, platinum, palladium, rhodium, rhenium, ruthenium, osmium and iridium or an alloy containing these metals may be used, though the metal is not particularly limited to these metals or alloys.

The amount of the above metal nobler than copper which is to be formed discretely on the surface of copper is, though not particularly limited to, preferably 0.001 µmol/dm$^2$ or more and 40 µmol/dm$^2$ or less. The amount of the metal to be formed is more preferably 0.01 µmol/dm$^2$ or more and 10 µmol/dm$^2$ or less and even more preferably 0.1 µmol/dm$^2$ or more and 4 µmol/dm$^2$ or less. When the amount of the metal to be formed is less than 0.001 µmol/dm$^2$, there is a tendency that it is difficult to form precise and uniform fine irregularities whereas when the amount of the metal to be formed exceeds 40 µmol/dm$^2$, the adhesive strength tends to drop. The amount of the metal nobler than copper which is discretely formed on the surface of copper can be found by dissolving the metal nobler than copper which is formed on the surface of copper by aqua regia and then quantitatively analyzing the obtained solution by an atomic absorption photometer. Also, the term "discretely" means that the surface of copper is not covered with a noble metal completely but a noble metal formed in an amount of 0.001 µmol/dm$^2$ or more and 40 µmol/dm$^2$ or less is dispersed on the surface of copper.

(Method of Oxidizing the Surface of Copper)

In the present invention, the metal nobler than copper is discretely formed on the surface of copper in the above manner, and then the surface of copper is oxidized by an alkaline solution containing an oxidant.

The above alkaline solution containing an oxidant is, though not particularly limited to, preferably an alkaline solution containing an alkali metal, alkali earth metal or the like and further an oxidant such as a chlorate, chlorite, hypochlorite, perchlorate and peroxodisulfate. The above alkaline solution containing an alkali metal or alkali earth metal may be obtained by adding an alkali metal compound or alkali earth metal compound such as sodium hydroxide, potassium hydroxide or sodium carbonate to a solvent such as water or water treated by an ion exchange resin. More specific examples of the above oxidant include sodium hypochlorite, sodium chlorite, sodium chlorate, sodium perchlorate, potassium hypochlorite, potassium chlorite, potassium chlorate, potassium perchlorate, ammonium peroxodisulfate, potassium peroxodisulfate and sodium peroxodisulfate. A phosphate may be added to the above alkaline solution. Examples of the phosphate which may be used include, though not limited to, trisodium phosphate, tripotassium phosphate and trilithium phosphate. Further, known organic acids or chelating agents may be added to the above alkaline solution.

The oxidation treatment using an alkaline solution containing an oxidant as mentioned above makes it possible to form irregularities made of crystals of copper oxide on the surface of copper. The amount of crystals of copper oxide is preferably 0.001 mg/cm$^2$ or more and 0.3 mg/cm$^2$ or less, more preferably 0.01 mg/cm$^2$ or more and 0.2 mg/cm$^2$ or less and even more preferably 0.03 mg/cm$^2$ or more and 0.1 mg/cm$^2$ or less. When the amount of crystals of copper oxide is less than 0.001 mg/cm$^2$, there is a tendency that a resist is peeled off and the adhesion to an insulating resin or the like tends to drop whereas when the amount of crystals of copper oxide exceeds 0.3 mg/cm$^2$, the prior art problems tend to arise. The amount of crystals of copper oxide formed on the surface of copper can be examined by measuring electrolytic reduction amount. For example, copper processed by oxidation treatment is used as a working electrode (negative electrode) which is energized with a constant quantity of electricity of 0.5 mA/cm$^2$ to measure the time required until the surface potential of copper is completely changed from the potential of copper oxide to the potential of metal copper, that is, until the surface potential is changed to a stable potential as low as −1.0 V or less, whereby the amount of copper oxide crystals can be found from the electrolytic reduction amount.

When carrying out the oxidation treatment using an alkaline solution containing an oxidant, the temperature of the alkaline solution is, though not particularly limited to, preferably 20 to 95° C., more preferably 30 to 80° C. and even more preferably 40 to 60° C. to carry out the oxidation treatment. As to the concentration of the alkaline solution containing the oxidant and the time required for oxidation treatment using the solution, it is preferable to select an appropriate condition such that the amount of copper oxide crystals is 0.001 mg/cm$^2$ or more and 0.3 mg/cm$^2$ or less.

(Method of Reducing Treatment)

The irregularities made of copper oxide crystals formed on the surface of copper by the above oxidation treatment can be converted to irregularities of metal copper by reducing treatment. In this reducing treatment, for example, an aqueous solution obtained by adding a formaldehyde, paraformaldehyde or aromatic aldehyde compound; an aqueous solution obtained by adding hypophosphoric acid or hypophosphate; an aqueous solution obtained by adding dimethylamineborane or a compound containing it or an aqueous solution obtained by adding borohydride or a compound containing it, in an alkaline solution adjusted to pH 9.0 to 13.5, may be used. More specifically, for example, HIST-100 (tradename, manufactured by Hitachi Chemical Co., Ltd., including HIST-100B and HIST-100D) may be used as the above reducing treatment solution. The alkaline solution shown here is, though not particularly limited to, an alkaline solution containing, for example, an alkali metal or alkali earth metal. To explain in more detail, the alkaline solution may be obtained by adding an alkali metal compound or alkali earth metal compound such as sodium hydroxide, potassium hydroxide or sodium carbonate to water or water treated with an ion exchange resin.

The above method is a method of reducing copper oxide chemically. Other than the above, copper oxide may be reduced electrically.

(Coupling Treatment)

After the above oxidation treatment, coupling treatment may be carried out to improve the adhesive strength between the surface of copper and the insulating layer (for example, buildup layer). The coupling treatment may be carried out after the above reducing treatment or corrosion inhibitive treatment. This makes it possible to improve the adhesion. Examples of the coupling agent used for the coupling treatment include silane type coupling agents, aluminum type coupling agents, titanium type coupling agents and zirconium type coupling agents. These agents may be used either singly or in combinations of two or more. Among these agents, silane type coupling agents are preferable. As the silane coupling agent, those having a functional group such as an epoxy group, amino group, mercapto group, imidazole group, vinyl group or methacryl group in their molecules are preferable. The above coupling agent may be mixed in a solvent to prepare a solution upon use. As the solvent to be used in the preparation of this coupling agent solution, water, alcohols, ketones or the like may be used though the solvent is not particularly limited to these solvents. A small amount of an acid such as acetic acid or hydrochloric acid may be added to promote hydrolysis of the coupling agent. The amount of the coupling agent is preferably 0.01% by weight to 5% by weight and more preferably 0.1% by weight to 1.0% by weight based on the total amount of the coupling agent solution. The treatment using the coupling agent may be carried out by a method in which copper to be a treatment subject is dipped in the coupling solution prepared in the above manner or a method in which the coupling solution is sprayed on or applied to the above copper. The above copper treated by the silane coupling agent is dried by natural drying, heating drying or vacuum drying. In this case, the copper may be washed with water or ultrasonically before dried though depending on the type of coupling agent to be used.

(Corrosion Inhibitive Treatment)

After the above oxidation treatment, corrosion inhibitive treatment may be carried out to restrain the copper from being corroded. This corrosion inhibitive treatment may be carried out after the above reducing treatment or coupling treatment. The corrosion inhibitive agent to be used in the corrosion inhibitive treatment may be, though not particularly limited to, one containing at least one type of sulfur-containing organic compounds and nitrogen-containing organic compounds. The corrosion inhibitive agent is, though not particularly limited to, preferably a compound containing a sulfur atom such as a mercapto group, sulfide group or disulfide group or a compound containing at least one or more nitrogen-containing organic compounds containing —N═, N═N or —NH$_2$.

Examples of the compound containing a sulfur atom such as a mercapto group, sulfide group or disulfide group include aliphatic thiols [having a structure represented by the formula HS—(CH$_2$)n-R (where n denotes an integer from 1 to 23 and R represents a monovalent organic group or a halogen atom): though R is preferably any one of an amino group, an amide group, a carboxyl group, a carbonyl group and a hydroxyl group, R is not limited to these groups and examples of R include an alkyl group having 1 to 18 carbon atoms, alkoxy group having 1 to 8 carbon atoms, acyloxy group, haloalkyl group, halogen atom, hydrogen group, thioalkyl group, thiol group, phenyl group which may be substituted, biphenyl group, naphthyl group and heterocyclic group. It is satisfactory if one and preferably one or more amino groups, amide groups, carboxyl groups or hydroxyl groups are present in R. Besides, R may have a substituent such as the above alkyl groups. It is preferable to use a compound represented by the above formula in which n is an integer from 1 to 23, more preferably from 4 to 15 and even more preferably 6 to 12], thiazole derivatives (for example, thiazole, 2-aminothiazole, 2-aminothiazole-4-carboxylic acid, aminothiophene, benzothiazole, 2-mercaptobenzothiazole, 2-aminobenzothiazole, 2-amino-4-methylbenzothiazole, 2-benzothiazolol, 2,3-dihydroimidazo[2,1-b]benzothiazole-6-amine, ethyl 2-(2-aminothiazole-4-yl)-2-hydroxyiminoacetate, 2-methylbenzothiazole, 2-phenylbenzothiazole and 2-amino-4-methylthiazole), thiadiazole derivatives (for example, 1,2,3-thiadiazole, 1,2,4-thiadiazole, 1,2,5-thiadiazole, 1,3,4-thiadiazole, 2-amino-5-ethyl-1,3,4-thiadiazole, 5-amino-1,3,4-thiadiazole-2-thiol, 2,5-mercapto-1,3,4-thiadiazole, 3-methylmercapto-5-mercapto-1,2,4-thiadiazole, 2-amino-1,3,4-thiadiazole, 2-(ethylamino)-1,3,4-thiadiazole and 2-amino-5-ethylthio-1,3,4-thiadiazole), mercaptobenzoic acid, mercaptonaphthol, mercaptophenol, 4-mercaptobiphenyl, mercaptoacetic acid, mercaptosuccinic acid, 3-mercaptopropionic acid, thiouracil, 3-thiourazole, 2-thiouramil, 4-thiouramil, 2-mercaptoquinoline, thioformic acid, 1-thiocoumarin, Thiocumothiazon, thiocresol, thiosalicylic acid, thiocyanuric acid, thionaphthol, thiotolene, thionaphthene, thionaphthenecarboxylic acid, thionaphthenequinone, thiobarbituric acid, thiohydroquinone, thiophenol, thiophene, thiphthalide, thiophthene, thiolthioncarbonic acid, thiolutidone, thiolhistidine, 3-carboxypropyl disulfide, 2-hydroxyethyl disulfide, 2-aminopropionic acid, dithiodiglycolic acid, D-cysteine, di-t-butyl disulfide, thiocyan and thiocyanic acid.

Preferable examples of the compound containing at least one or more nitrogen-containing organic compounds containing —N═, N═N or —NH$_2$ in its molecule include triazole derivatives (for example, 1H-1,2,3-triazole, 2H-1,2,3-triazole, 1H-1,2,4-triazole, 4H-1,2,4-triazole, benzotriazole, 1-aminobenzotriazole, 3-amino-5-mercapto-1,2,4-triazole, 3-amino-1H-1,2,4-triazole, 3,5-diamino-1,2,4-triazole, 3-oxy-1,2,4-triazole and aminourazol), tetrazole derivatives (tetrazolyl, tetrazolylhydrazine, 1H-1,2,3,4-tetrazole, 2H-1,2,3,4-tetrazole, 5-amino-1H-tetrazole, 1-ethyl-1,4-dihydroxy-5H-tetrazol-5-one, 5-mercapto-1-methyltetrazole and tetrazolemercaptan), oxazole derivatives (for example, oxazole, oxazolyl, oxazoline, benzoxazole, 3-amino-5-methylisoxazole, 2-mercaptobenzoxazole, 2-aminooxazoline and 2-aminobenzoxazole), oxadiazole derivatives (for example, 1,2,3-oxadiazole, 1,2,4-oxadiazole, 1,2,5-oxadiazole, 1,3,4-oxadiazole, 1,2,4-oxadiazolone-5 and 1,3,4-oxadiazolone-5), oxatriazole derivatives (for example, 1,2,3,4-oxatriazole and 1,2,3,5-oxatriazole), purine derivatives (for example, purine, 2-amino-6-hydroxy-8-mercaptopurine, 2-amino-6-methylmercaptopurine, 2-mercaptoadenine, mercaptohypoxanthene, mercaptopurine, uric acid, guanine, adenine, xanthene, theophylline, theobromine and caffeine), imidazole derivatives (for example, imidazole, benzoimidazole, 2-mercaptobenzoimidazole, 4-amino-5-imidazolecarboxylic acid amide and histidine), indazole derivatives (for example, indazole, 3-indazolone and indazolol), pyridine derivatives (2-mercaptopyridine and aminopyridine), pyrimidine derivatives (2-mercaptopyrimidine, 2-aminopyrimidine, 4-aminopyrimidine, 2-amino-4,6-dihydroxypyrimidine, 4-amino-6-hydroxy-2-mercaptopyrimidine, 2-amino-4-hydroxy-6-methylpyrimidine, 4-amino-6-hydroxy-2-methylpyrimidine, 4-amino-6-hydroxypyrazolo[3,4-d]pyrimidine, 4-amino-6-mercaptopyrazolo[3,4-d]pyrimidine, 2-hydroxypyrimidine, 4-mercapto-1H-pyrazolo[3,4-d]pyrimidine, 4-amino-2,6-dihydroxypyrimidine, 2,4-diamino-6-hydroxypyrimidine and 2, 4-6-triaminopyrimidine), thiourea derivatives (for example, thiourea, ethylenethiourea and 2-thiobarbituric acid), amino acid (glycine, alanine, triptophane, proline and oxyproline), 1,3,4-thioxadiazolone-5, thiocumazone, 2-thiocoumarin, thiosaccharin, thiohydantoin, thiopyrine, γ-thiopyrineguanazine, guanazole, guanamine, oxazine, oxadiazine, melamine, 2,4,6-triaminophenol, triaminobenzene, aminoindole, aminoquinoline, aminothiophenol and aminopyrazole.

Water or an organic solvent may be used to prepare a solution containing the above corrosion inhibitive agent. No particular limitation to the type of the above organic solvent and alcohols such as methanol, ethanol, n-propyl alcohol and n-butyl alcohol, ethers such as di-n-propyl ether, di-n-butyl ether and diallyl ether, aliphatic hydrocarbons such as hexane, heptane, octane and nonane and aromatic hydrocarbons such as benzene, toluene and phenol may be used. These solvents may be used either singly or in combinations of two or more. The above corrosion inhibitive agent may be added to the above alkaline solution containing an oxidant or coupling agent solution upon use.

The concentration of the solution containing the above corrosion inhibitive agent is preferably 0.1 to 5000 ppm, more preferably 0.5 to 3000 ppm and even more preferably 1 to 1000 ppm. When the concentration of the corrosion inhibitive agent is less than 0.1 ppm, there is a tendency that the ion migration inhibiting effect and the adhesive strength between the surface of copper and the insulating layer is reduced. When the concentration of the corrosion inhibitive agent exceeds 5000 ppm, on the other hand, the adhesive strength between the surface of copper and the insulating layer tends to decrease though the ion migration inhibiting effect is obtained. The treating time using the solution containing the corrosion inhibitive agent is preferably changed properly according to the type and concentration of the corrosion inhibitive agent, though no particular limitation is imposed on the treating time. Ultrasonic cleaning may be carried out after this treatment.

(Resist)

Examples of the resist to be used in the present invention include an etching resist, plating resist, solder resist and cover lay. These etching resist and plating resist are peeled after forming the wiring because they are used with the intention of forming the wiring and are not left on the substrate. The above solder resist and cover ray are formed on the surface of the substrate because they are formed for the purpose of protecting the wiring other than external connecting terminals and semiconductor chip connecting terminals. As these resists, a liquid or filmy one may be used and it is preferably photosensitive.

(Substrate for Mounting a Semiconductor Chip)

Figure 1:
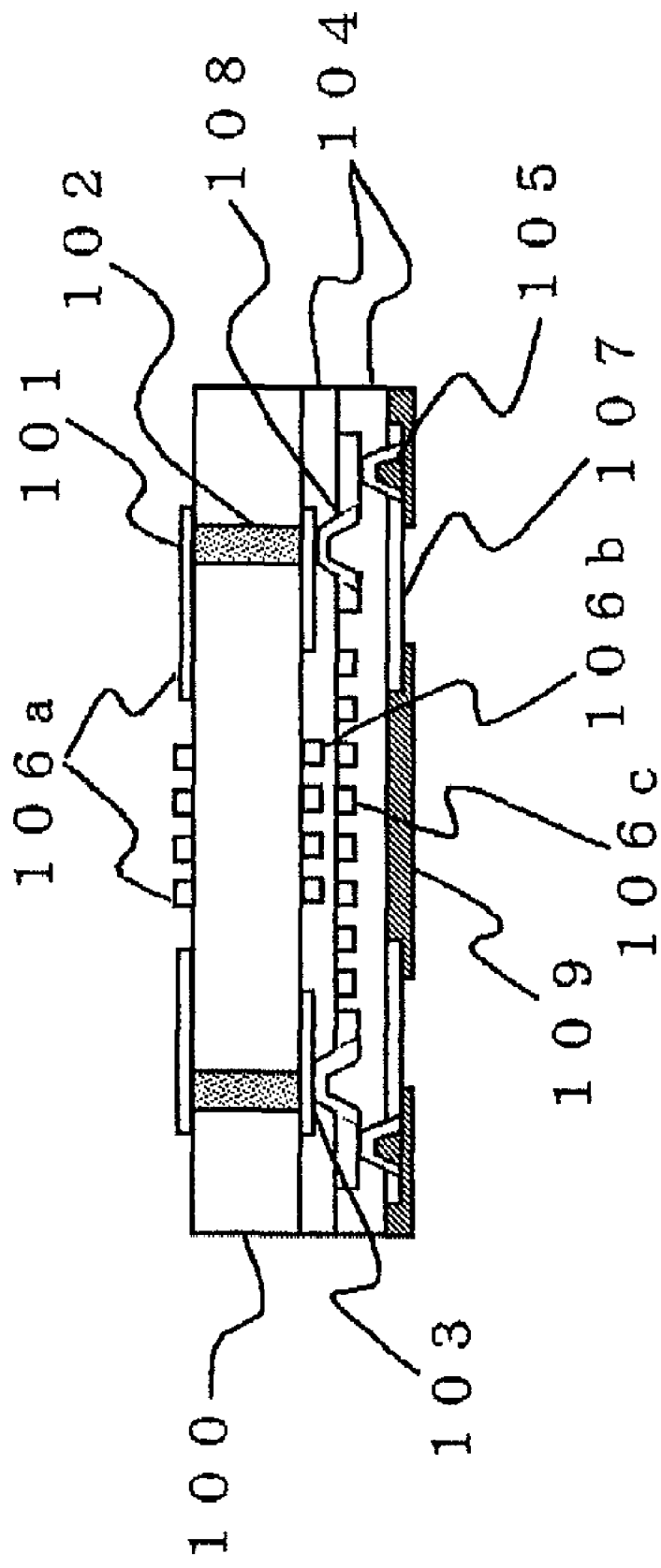
Figure 8:
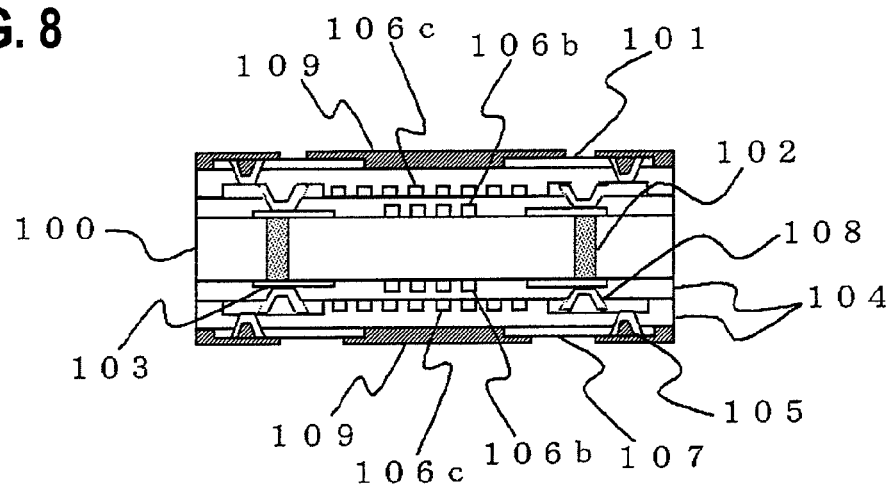
FIG. 8 is a sectional view of a substrate for mounting a semiconductor chip to which one embodiment according to the present invention is applied.

FIG. 1 shows a sectional typical view of an embodiment (two buildup layers on one side) of a substrate for mounting a semiconductor chip according to the present invention. Here, explanations will be furnished as to an embodiment in which the buildup layer (interlayer insulating layer) is formed on only one surface. However, the buildup layer may be formed on both surfaces as shown in FIG. 8 according to the need.

In the substrate mounted with a semiconductor chip according to the present invention, as shown in FIG. 1, a first wiring 106a including a semiconductor chip connecting terminal and a first interlayer connecting terminal 101 is formed on a core substrate 100 which is an insulating layer on the side on which a semiconductor chip is mounted. A second wiring 106b including a second interlayer connecting terminal 103 is formed on the other side of the core substrate and the first interlayer connecting terminal and the second interlayer connecting terminal are electrically connected to each other through the first interlayer connecting IVH (interstitial via-hole) 102 of the core substrate. A buildup layer 104 is formed on the second wiring side of the core substrate and a third wiring 106c including a third interlayer connecting terminal is formed on the buildup layer. The second interlayer connecting terminal is electrically connected to the third interlayer connecting terminal through the second interlayer connecting IVH 108.

When plural buildup layer are formed, the same structures are laminated on each other and an external connecting terminal 107 to be connected to a mother board is formed on the buildup layer as the outermost layer. Further, the external connecting terminal is electrically connected to the third interlayer connecting terminal through a third interlayer connecting IVH 105. No particular limitation is imposed on the shape of the wiring and the positions of the connecting terminals. These wiring shape and positions of the connecting terminals may be optionally designed to produce a semiconductor chip and a semiconductor package to be intended. Also, it is possible to use the semiconductor chip connecting terminal and the first interlayer connecting terminal in common. Moreover, an insulation coating 109 such as a solder resist may be provided on the buildup layer as the outermost layer according to the need.

(Core Substrate)

Although there is no particular limitation to the material of the core substrate, an organic base material, ceramic base material, silicon base material or glass base material may be used. It is preferable to use ceramics or glasses in consideration of thermal expansion coefficient and insulation. Examples of a nonphotosensitive glass among the glasses include soda-lime glass (example of components: $SiO_2$ 65 to 75 wt %, $Al_2O_3$ 0.5 to 4 wt %, CaO 5 to 15 wt %, MgO 0.5 to 4 wt %, $Na_2O$ 10 to 20 wt %) and boro-silicate glass (example of components: $SiO_2$ 65 to 80 wt %, $B_2O_3$ 5 to 25 wt %, $Al_2O_3$ 1 to 5 wt %, CaO 5 to 8 wt %, MgO 0.5 to 2 wt %, $Na_2O$ 6 to 14 wt %, $K_2O$ 1 to 6 wt %). Also, examples of the photosensitive glass include those obtained by compounding a gold ion or a silver ion as a photosensitive agent in $Li_2O$—$SiO_2$ type crystallized glass.

As the organic substrate, a substrate obtained by laminating materials prepared by impregnating a glass fiber with a resin or a resin film may be used. As the resin to be used, a thermosetting resin, thermoplastic resin or mixture of these resins may be used and a thermosetting organic insulating material is preferable. As the thermosetting resin, a phenol resin, urea resin, melamine resin, alkyd resin, acryl resin, unsaturated polyester resin, diallylphthalate resin, epoxy resin, polybenzoimidazole resin, polyamide resin, polyamidoimide resin, silicon resin, resin synthesized from cyclopentadiene, resin containing tris(2-hydroxyethyl)isocyanurate, resin synthesized from aromatic nitrile, trimer aromatic dicyanamide resin, resin containing triallyltrimethacryate, furan resin, ketone resin, xylene resin, thermosetting resin containing a condensed polycyclic aromatic compound, benzocyclobutene resin or the like may be used. Examples of the thermoplastic resin include a polyimide resin, polyphenylene oxide resin, polyphenylene sulfide resin, alamide resin or a liquid crystal polymer.

A filler may be added to these resins. Examples of the filler include silica, talc, aluminum hydroxide, aluminum borate, aluminum nitride and alumina.

The thickness of the core substrate is preferably 100 to 800 μm in the point of the ability to form IVH and is more preferably 150 to 500 μm.

(Buildup Layer)

The interlayer insulating layer (buildup layer) 104 is made of an insulating material. As the insulating material, a thermosetting resin, a thermoplastic resin or a mixture of these resins may be used. Also, the buildup layer is preferably made of a material containing a thermosetting organic insulating material as its major component. As the thermosetting resin, a phenol resin, urea resin, melamine resin, alkyd resin, acryl resin, unsaturated polyester resin, diallylphthalate resin, epoxy resin, polybenzoimidazole resin, polyamide resin, polyamidoimide resin, silicon resin, resin synthesized from cyclopentadiene, resin containing tris(2-hydroxyethyl)isocyanurate, resin synthesized from aromatic nitrile, trimer aromatic dicyanamide resin, resin containing triallyltrimethacryate, furan resin, ketone resin, xylene resin, thermosetting resin containing a condensed polycyclic aromatic compound, benzocyclobutene resin or the like may be used. Examples of the thermoplastic resin include a polyimide resin, polyphenylene oxide resin, polyphenylene sulfide resin, alamide resin or a liquid crystal polymer.

A filler may be added to these resins. Examples of the filler include silica, talc, aluminum hydroxide, aluminum borate, aluminum nitride and alumina.

(Coefficient of Thermal Expansion)

It is preferable that the thermal expansion coefficient of the semiconductor chip be approximate to that of the core substrate and also, the thermal expansion coefficient of the core substrate be approximate to that of the buildup layer, though not particularly limited thereto. It is more preferable that when the thermal expansion coefficients of the semiconductor chip, core substrate and buildup layer are $\alpha 1$, $\alpha 2$ and $\alpha 3$ (ppm/° C.) respectively, the following equation be established: $\alpha 1 \leq \alpha 2 \leq \alpha 3$.

Specifically, the thermal expansion coefficient $\alpha 2$ of the core substrate is preferably 7 to 13 ppm/° C. and more preferably 9 to 11 ppm/° C. The thermal expansion coefficient $\alpha 3$ of the buildup layer is preferably 10 to 40 ppm/° C., more preferably 10 to 20 ppm/° C. and even more preferably 11 to 17 ppm/° C.

(Young's Modulus)

The Young's modulus of the buildup layer is preferably 1 to 5 GPa in view of thermal stress relaxation. The filler in the buildup layer is preferably added in an amount properly adjusted such that the thermal expansion coefficient and Young's modulus of the buildup layer are 10 to 40 ppm/° C. and 1 to 5 GPa respectively.

(Method of Producing a Substrate for Mounting a Semiconductor Chip)

The substrate for mounting a semiconductor chip may be produced by a combination of the following production methods. There is no limitation to the order of production processes insofar as it is within the range not departing from the object of the present invention.

(Method of Forming Wiring)

Examples of the method of forming the wiring include a method in which a metal foil is formed on the surface of the core substrate or on the buildup layer and unnecessary part of the metal foil is removed by etching (subtractive method), a method in which the wiring is formed by plating only in necessary places on the surface of the core substrate or on the buildup layer (additive method) and a method in which a thin metal layer (seed layer) is formed on the surface of the core substrate or on the buildup layer, then necessary wiring is formed by electrolytic plating, and then the thin metal layer is removed by etching (semi-additive method).

(Formation of Wiring by a Subtractive Method)

An etching resist is formed on the place which is to be the wiring on a metal foil and a chemical etching solution is sprayed on the place exposed from the etching resist to remove unnecessary metal foil parts, whereby the wiring can be formed. In the case of using, for example, a copper foil as the metal foil, an etching resist which can be used for usual wiring boards may be used as the etching resist. For example, resist ink is applied by silk screen printing to form an etching resist or a negative type photosensitive dry film for etching resist is laminated on the copper foil, a photomask transmitting light wiring-wise is overlapped on the film to expose the film to ultraviolet light and the places unexposed to light are removed by a developer to form an etching resist. As the chemical etching solution, chemical etching solutions such as a solution of cupric chloride and hydrochloric acid, a ferric chloride solution, a solution of sulfuric acid and hydrogen peroxide and an ammonium persulfate solution, which may be used for usual wiring boards, may be used.

(Formation of Wiring Using an Additive Method)

Also, the wiring can be formed by plating only necessary places on the core substrate or buildup layer and in this case, usual wiring formation technologies using plating may be used. For example, after an electroless plating catalyst is stuck to the core substrate, a plating resist is formed on the surface part to be non-plated and the substrate is dipped in an electroless plating solution to allow only the places coated with no plating resist to be electroless-plated, thereby forming the wiring.

(Formation of Wiring Using a Semi-Additive Method)

Examples of the method of forming the seed layer used in the semi-additive method on the surface of core substrate or buildup layer include a method using vapor deposition or plating and a method of applying a metal foil. Using the similar method, the metal foil used in the subtractive method may be formed.

(Formation of the Seed Layer by Vapor Deposition or Plating)

The seed layer may be formed on the surface of the core substrate or on the buildup layer by vapor deposition or plating. For example, in the case of forming a base metal and a thin film copper layer as the seed layer by sputtering, a two-electrode sputter, three-electrode sputter, four-electrode sputter, magnetron sputter, mirrortron sputter or the like may be used as the sputtering apparatus used to form the thin film copper layer. As the target used in sputtering, Cr, Ni, Co, Pd, Zr, Ni/Cr, Ni/Cu or the like is used as the base metal to carry out sputtering such that the thickness of the metal is 5 to 50 nm to secure adhesion. Then, copper is used as the target to carry out sputtering such that the thickness of the metal is 200 to 500 nm, whereby the seed layer can be formed. Also, plated copper of 0.5 to 3 µm in thickness may be formed on the surface of the core substrate or on the buildup layer by electroless copper plating.

(Method of Applying a Metal Foil)

When the core substrate or the buildup layer has an adhesive function, the seed layer may be formed by applying the metal foil by means of pressing or lamination. However, because it is difficult to apply a thin metal layer directly, there is a method in which after a thick metal foil is applied, it is thinned by etching or the like or a method in which after a metal foil with a carrier is applied, the carrier layer is peeled off. As the former case, there is, for example, a three-layer copper foil made of carrier copper/nickel/thin film copper, wherein carrier copper can be removed using an alkali etching solution and nickel can be removed using a nickel etching solution. As the latter case, a peelable copper foil using aluminum, copper or an insulating material as the carrier may be used and a seed layer of 5 µm or less in thickness can be formed. The following method may also be used without any problem: a copper foil having a thickness of 9 to 18 µm is applied and is then thinned uniformly by etching so as to decrease the thickness to 5 µm or less to form a seed layer.

A plating resist having a desired pattern is formed on the seed layer formed in the above method to form the wiring through the seed layer by electrolytic copper plating. After that, the plating resist is peeled off and finally, the seed layer is removed by etching or the like, whereby the wiring can be formed.

(Shape of Wiring)

Figure 5:
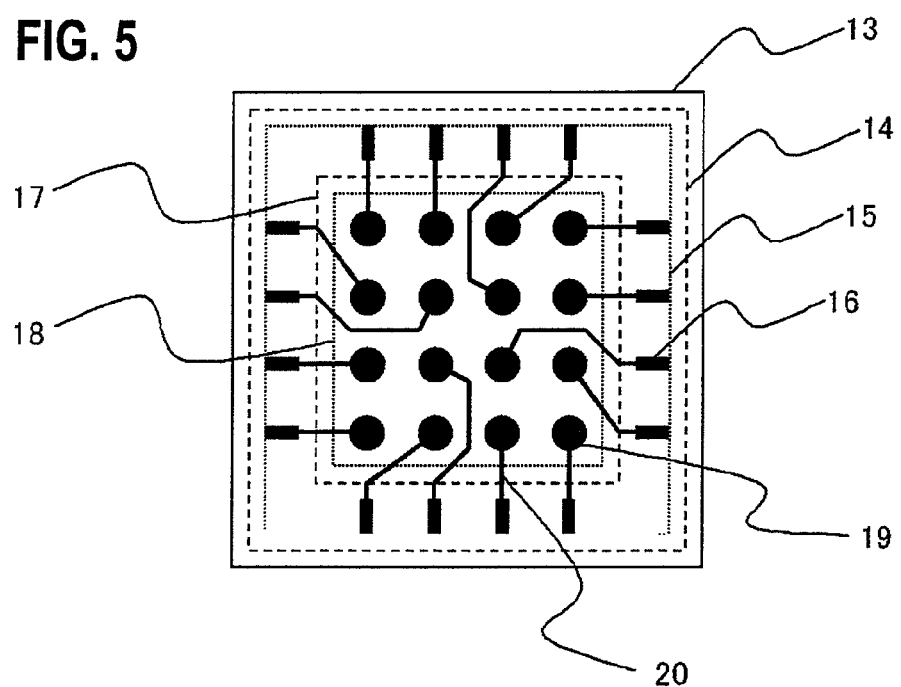
FIG. 5 is a plan view of a fan-in type substrate for mounting a semiconductor chip according to the present invention.
Figure 6:
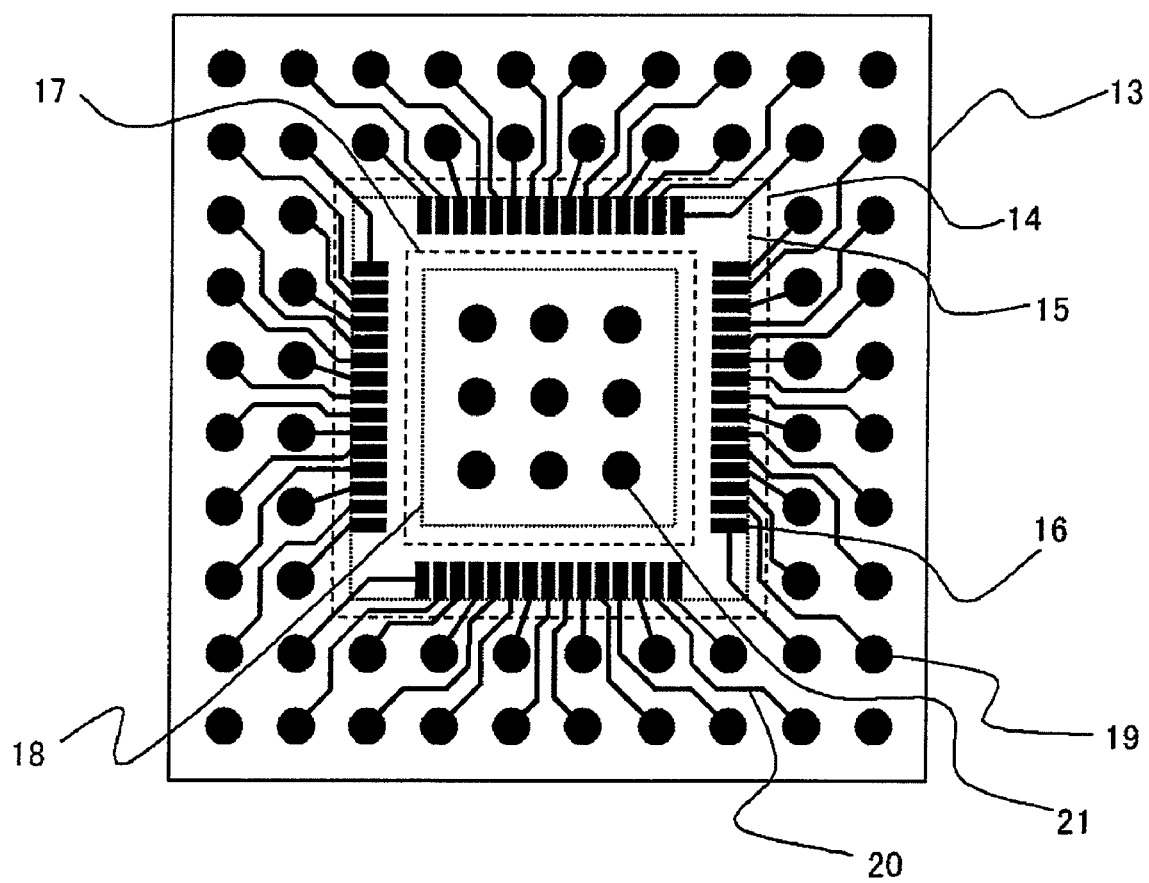
FIG. 6 is a plan view of a fan-out type substrate for mounting a semiconductor chip according to the present invention.

Although no particular limitation is imposed on the shape of the wiring, the wiring is at least constituted of, for example, a semiconductor chip connecting terminal 16 (wire bond terminal and the like) on the side mounted with a semiconductor chip and, on the opposite side, an external connecting terminal (place where a solder ball and the like are mounted) electrically connected to a mother board, expansion wiring that connects these terminals and a interlayer connecting terminal. Also, though there is no limitation to the location of the wiring, a fan-in type substrate for mounting a semiconductor chip in which, as shown in FIG. 5 (inner layer wiring and interlayer connecting terminal etc. are omitted), an external connecting terminal 19 is formed on the inner side than the semiconductor chip connecting terminal 16, a fan-out type substrate for mounting a semiconductor chip in which an external connecting 19 is formed on the outer side than the semiconductor chip connecting terminal 16, or a combination thereof may be used. In FIGS. 5 and 6, 13 represents a semiconductor package area, 14 represents a die bond film binding area (flip chip type), 15 represents a semiconductor chip mounting area (flip chip type), 17 represents a die bond film binding area (wire bond type), 18 represents a semiconductor chip mounting area (wire bond type) and 20 represents an expansion wiring. Also, the semiconductor chip connecting terminal 16 may have any shape without any particular limitation insofar as wire bond connection or flip chip connection is possible. Also, it is possible to attain wire bond connection or flip chip connection in any of a fan-out type and a fan-in type. Moreover, according to the need, a dummy pattern 21 (see FIG. 6) which is not electrically connected to the semiconductor chip may be formed. Though no particular limitation is imposed on the shape and location of the dummy pattern, it is preferable to locate it uniformly in the area on which the semiconductor chip is mounted. This ensures that voids scarcely arise when the semiconductor chip is mounted using a die bond adhesive, improving the reliability.

(Via-Hole)

Because a multilayer substrate for mounting a semiconductor chip has plural wiring layers, a via-hole that electrically connects wiring of each layer. The via-hole can be formed by forming a connecting hole in the core substrate or buildup layer and this hole is filled with a conductive paste or by plating. Examples of the method of processing the hole include mechanical processing using a punch or drill, laser processing, chemical etching processing using a chemical solution and a dry etching method using a plasma.

Also, as a method of forming the via-hole on the buildup layer, there is also a method in which a conductive layer is formed on the buildup layer by using a conductive paste or by plating in advance, and then the buildup layer is laminated on the core substrate by using a press or the like.

(Formation of an Insulation Coating)

An insulation coating may be formed on the external connecting terminal side of the substrate for mounting a semiconductor chip. The pattern may also be formed by printing if a varnish-like material is used. However, in order to more secure accuracy, it is preferable to use a photosensitive solder resist, cover lay film or film-like resist. As the material, an epoxy type, polyimide type, epoxyacrylate type or fluorene type material may be used.

The insulation coating like this tends to cause a large warpage of the substrate if it is formed on only one surface because it shrinks when cured. Therefore, according to the need, the insulation coating may be formed on both surfaces of the substrate for mounting a semiconductor chip. Moreover, because the warpage is changed according to the thickness of the insulation coating, it is more preferable that each thickness of the insulation coatings on both surfaces be controlled so as to prevent the generation of warpage. In this case, it is preferable to make pre-examination to determine each thickness of the insulation coatings on both surfaces. Also, to make a thin type semiconductor package, the thickness of the insulation coating is preferably 50 μm or less and more preferably 30 μm or less.

(Plating for Wiring)

The necessary parts of the wiring may be plated with nickel and gold one by one. Moreover, according to the need, these parts may be plated with nickel, palladium and gold. The plating of these materials may be provided to a semiconductor chip connecting terminal of the wiring and to an external connecting terminal connected electrically with a mother board or other semiconductor package. As this plating, any of electroless plating and electrolytic plating may be used.

(Method of Producing a Substrate for Mounting a Semiconductor Chip)

Figure 2:
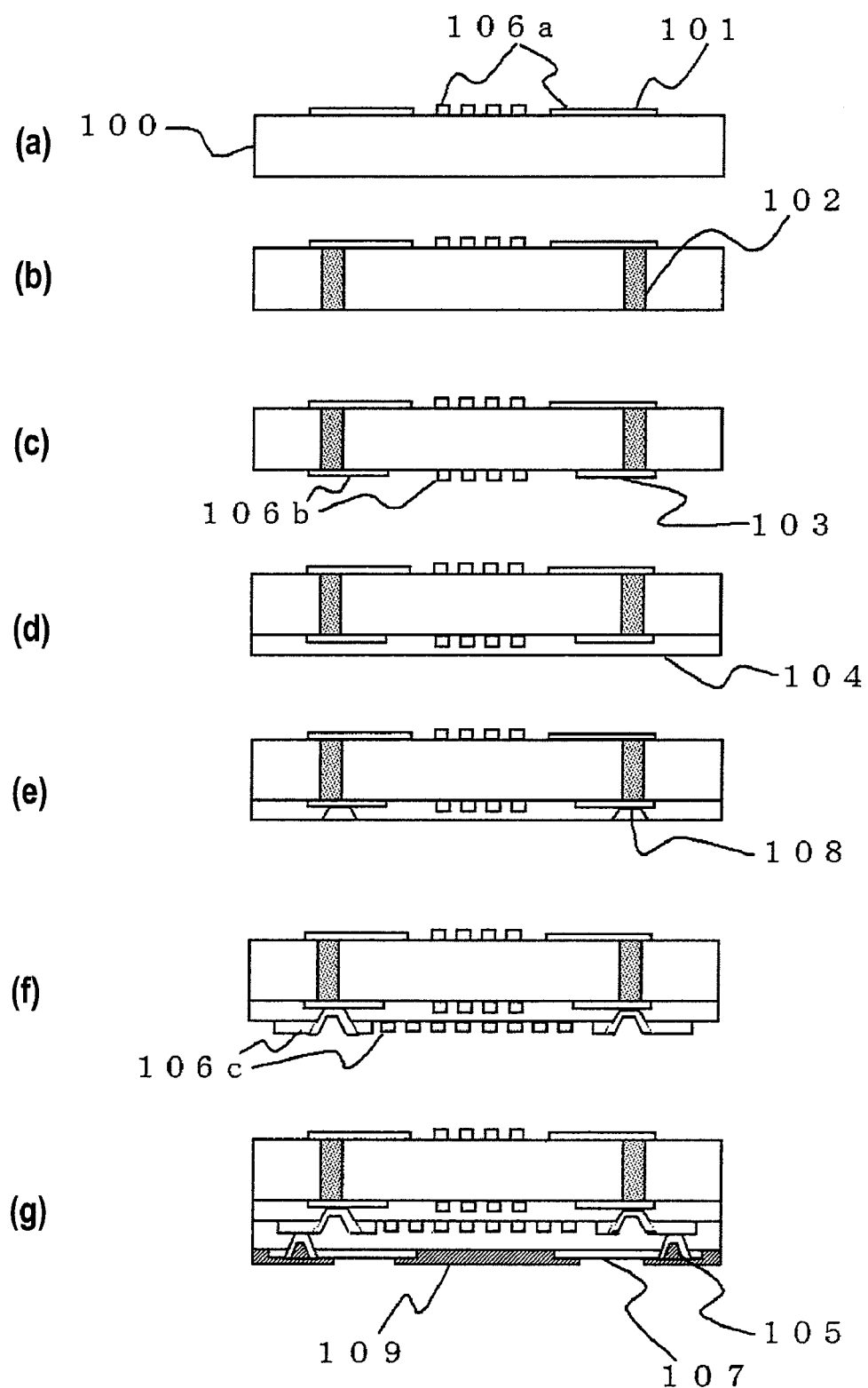

The substrate for mounting a semiconductor chip like this may be produced in the following process. FIGS. 2(*a*) to 2(*g*) shows a sectional typical view of one embodiment of a method of producing a substrate for mounting a semiconductor chip according to the present invention. However, no particular limitation is imposed on the order of process steps within the range not departing from the object of the present invention.

(Step a)

The (step a) is a step of manufacturing the first wiring 106*a* on the core substrate 100 as shown in FIG. 2(*a*). The first wiring 106*a* may be formed, for example, by the following method. Specifically, a copper layer formed on the one side of the core substrate is defatted and washed with hydrochloric acid or sulfuric acid. Then, a metal selected from gold, silver, platinum, palladium, rhodium, rhenium, ruthenium, osmium and iridium which are nobler than copper or an alloy containing these metals is formed discretely on the copper layer and the substrate is dipped in an aqueous alkaline solution containing an oxidant to carry out oxidation treatment. Then, an etching resist is formed in the form of the first wiring on the oxidized copper layer and the copper layer is etched using an etching solution containing copper chloride or iron chloride, sulfuric acid-hydrogen peroxide or nitric acid-hydrogen peroxide, followed by removing the etching resist, thereby producing the first wiring 106*a*. Also, it is preferable to further carry out one or more treatment selected from the group consisting of reducing treatment, coupling treatment and corrosion inhibitive treatment, after the above oxidation treatment. In any case, these treatments are carried out such that the roughness Rz of the surface of the wiring is 1 nm or more and 1,000 nm or less. In order to form the copper layer on the core substrate 100, a copper thin film is formed by, for example, sputtering, vapor deposition or plating and then electroplating using copper is carried out until the film has a desired thickness, whereby the copper layer can be formed. The first wiring 106*a* include the first interlayer connecting terminal 101 and the semiconductor chip connecting terminal (part connected electrically to the semiconductor chip) and a semi-additive method may be used as a method of forming fine wiring.

(Step b)

The (step b) is a step of forming the first interlayer connecting IVH 102 (via-hole) that connects the above first interlayer connecting terminal 101 to a second wiring which will be explained later as shown in FIG. 2(*b*).

The hole which is to be the via-hole can be formed by irradiating the place to be the via-hole with laser light such as a $CO_2$ laser, YAG laser or excimer laser, when the core substrate 100 is a nonphotosensitive base material. It is preferable to use a $CO_2$ laser from the viewpoint of productivity and the quality of the hole. When the IVH diameter is less than 30 μm, a YAG laser enabling laser light to be contracted is preferable. Examples of the nonphotosensitive base material include, though not particularly limited to, the aforementioned nonphotosensitive glass. Also, when the core substrate 100 is a photosensitive base material, an area other than the place to be the via-hole is masked to irradiate the substrate with ultraviolet light, followed by heat treatment and etching to form a hole to be the via-hole. Examples of the photosensitive base material include, though not limited to, the aforementioned photosensitive glass. Also, when the core substrate 100 is made of a base material which can be processed by chemical etching using a chemical solution such as an organic solvent, a hole to be the via-hole can be formed by chemical etching. After the hole to be the via-hole is formed, desmearing treatment is carried out according to the need to attain the electrical connection between layers. Then, the hole is made to be electrically conductive by a conductive paste or by plating to make a via-hole.

(Step c)

The (step c) is a step of forming the second wiring 106b on the surface opposite to the first wiring 106a side of the core substrate 100. The second wiring 106b may be formed on the surface opposite to the first wiring 106a side of the core substrate 100 in the same manner as in the case of the first wiring. As to a method of forming the copper layer, it can be formed by forming a copper thin film by sputtering vapor deposition, plating or the like and then electroplating using copper is carried out until the film has a desired thickness in the same manner as the (step a). The second wiring 106b includes the second interlayer connecting terminal 103 and a semi-additive method may be used as the method of forming fine wiring.

(Step d)

The (step d) is a step of forming the buildup layer (interlayer insulating layer) 104 on the surface on which the second wiring 106b is formed as shown in FIG. 2(d). Here, the surface of the second wiring 106b is preferably defatted and washed with hydrochloric acid or sulfuric acid. Then, a metal selected from gold, silver, platinum, palladium, rhodium, rhenium, ruthenium, osmium and iridium which are nobler than copper or an alloy containing these metals is formed discretely on the copper wiring layer (on the second wiring 106b) and the substrate is dipped in an aqueous alkaline solution containing an oxidant to carry out oxidation treatment. Then, reducing treatment is carried out according to the need. Then, one or more treatment selected from the group consisting of reducing treatment, coupling treatment and corrosion inhibitive treatment are carried out such that the roughness Rz of the surface of the copper wiring is 1 nm or more and 1,000 nm or less.

Next, the buildup layer 104 is formed on the surface of the core substrate 100 and the surface of the second wiring 106b. As the insulating material of the buildup layer 104, a thermosetting resin, thermoplastic resin or a mixture of these resins may be used. However, a thermosetting material is used as a major component. The buildup layer 104 can be formed by printing or spin coating when the insulating material is a varnish-like material or by laminating or pressing when the insulating material is a film-like material. When the insulating material contains a thermosetting material, it is preferable that it be further cured by heating.

(Step e)

The (step e) is, as shown in FIG. 2(e), a step of forming the second interlayer connecting IVH (via-hole) 108 in the buildup layer 104. As to the forming measure, this step may be carried out in the same manner as in the case of the first interlayer connecting IVH 102 in the above step (b).

(Step f)

The (step f) is a step of forming the third wiring 106c on the buildup layer on which the above IVH 108 is formed as shown in FIG. 2(f). The third wiring 106c may be formed in the same manner as in the case of the first wiring 106a in the above step (step a). As a process forming wiring having a L/S of 35 μm/35 μm or less, the aforementioned semi-additive method is preferable. It is also preferable that the aforementioned seed layer be formed on the buildup layer 104 by a vapor deposition method, a plating method or a method of applying a metal foil. In this case, a plating resist is formed into a desired pattern on the seed layer, the wiring is formed through the seed layer by electroplating using copper, then the plating resist is peeled off and finally, the seed layer is removed by etching or the like, whereby fine wiring can be formed.

The (step d) to the (step f) may be repeated to form two or more buildup layers 104 as shown in FIG. 2(g) In this case, the interlayer connecting terminal formed on the outermost buildup layer is the external connecting terminal 107.

(Step g)

The (step g) is a step of forming the insulation coating 109 that protects wiring or the like except for the external connecting terminal 107. As the insulation coating material, a solder resist is used and a heat-curable type or ultraviolet ray-curable type solder resist may be used. However, a ultraviolet ray-curable type enabling the resist to have an exactly finished shape is preferable. First, the external connecting terminal 107 and other wirings are defatted and washed with hydrochloric acid or sulfuric acid. Then, a metal selected from gold, silver, platinum, palladium, rhodium, rhenium, ruthenium, osmium and iridium which are nobler than copper or an alloy containing these metals is formed discretely on the wirings and the substrate is dipped in an aqueous alkaline solution containing an oxidant to carry out oxidation treatment. Thereafter, it is preferable that reducing treatment be further carried out. Then, though at least one or more of coupling treatment and corrosion inhibitive treatment may be carried out, these treatments are carried out such that the roughness Rz of the surface of the wiring is 1 nm or more and 1,000 nm or less in any case. Thereafter, a solder resist is formed on the part except for the external connecting terminal 107 to expose the external connecting terminal 107. The external connecting terminal 107 is electrically connected to the third wiring through the third interlayer connecting IVH 105.

(Shape of a Substrate for Mounting a Semiconductor Chip)

Figure 7:
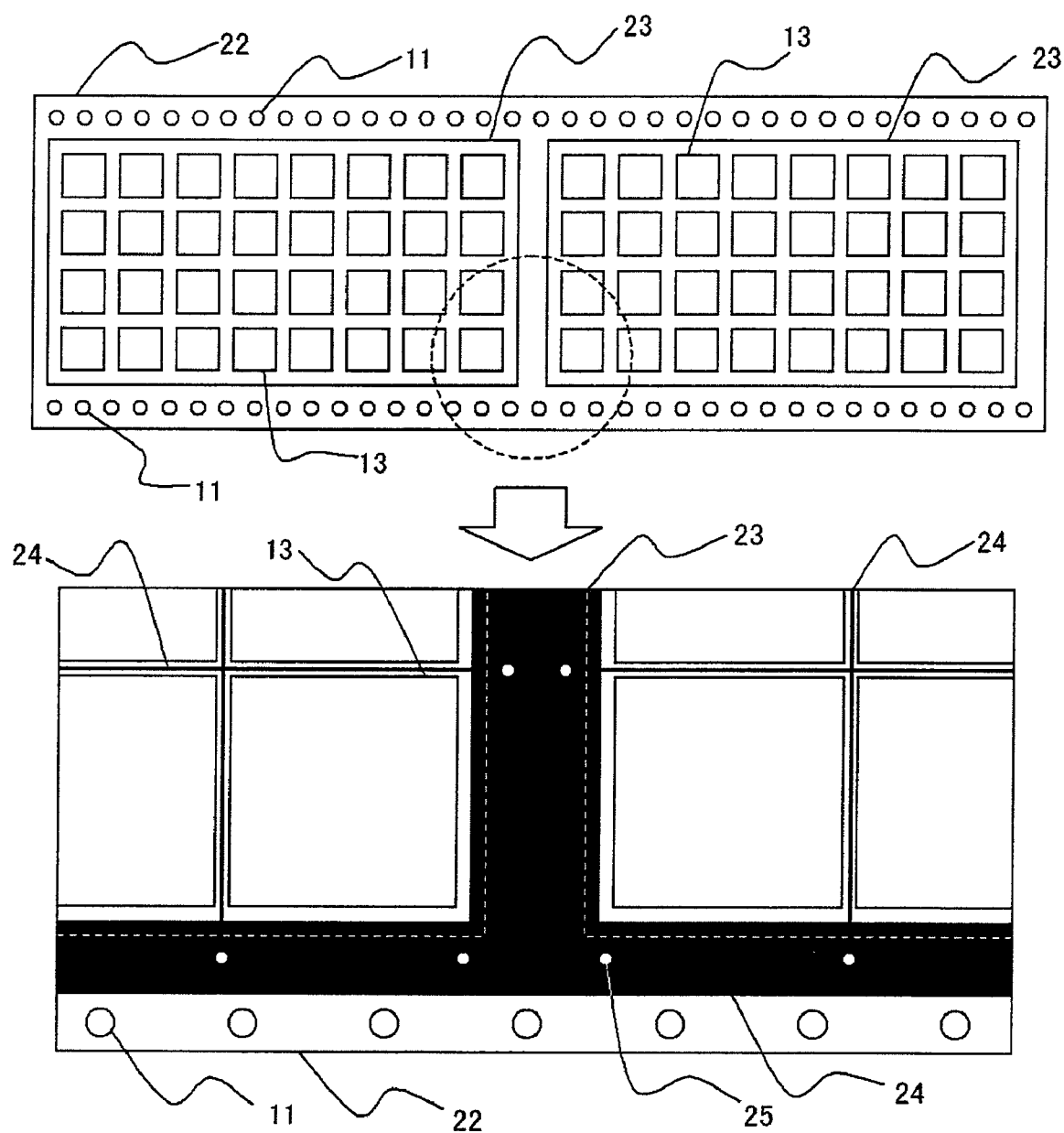
FIG. 7 is a plan view showing the shape of the frame of a substrate for mounting a semiconductor chip according to the present invention.

Though as the shape of the substrate for mounting a semiconductor chip, any shape may be adopted without any particular limitation, a frame shape as shown in FIG. 7 is preferably adopted. When the substrate for mounting a semiconductor chip is made to have a frame shape, the semiconductor package can be assembled efficiently. A preferable frame shape will be explained in detail.

As shown in FIG. 7, a block 23 is formed in which plural semiconductor package areas 13 (a part of one semiconductor package) are arranged lattice-wise apart from each other in each line and row. Further, such blocks are formed in plural lines and in plural rows. Though only two blocks are described in FIG. 7, the blocks may be formed lattice-wise according to the need. Here, the width of the space part between semiconductor package areas is 50 to 500 μm and more preferably 100 to 300 μm. It is even more preferable that the width of the space part be equal to the blade width of a dicer used to cut the semiconductor package later.

If the semiconductor package area is arranged like this, the substrate for mounting a semiconductor chip is utilized efficiently. Also, it is preferable to form an alignment mark 11 at the end of the substrate for mounting a semiconductor chip and the alignment mark is preferably a pinhole made of a through-hole. The shape and position of the pinhole may be selected in accordance with a method of forming it or a semiconductor package assembling apparatus.

Moreover, it is preferable to form a reinforcing pattern 24 on the space part between the above semiconductor package areas and on the outside of the above blocks. Although the reinforcing pattern may be manufactured separately and applied to the substrate for mounting a semiconductor chip, it is preferably a metal pattern formed simultaneously when the wiring is formed on the semiconductor package area. Moreover, on the surface of the reinforcing pattern, plating using for example, nickel or gold or insulation coating is preferably provided. When the reinforcing pattern is a metal pattern like this, it may be utilized as a plating lead in electrolytic plating. Also, on the outside of the block, it is preferable to form an alignment mark 25 used when the substrate is cut by a dicer. Thus, a frame-shape substrate for mounting a semiconductor chip can be manufactured.

(Semiconductor Package)

Figure 3:
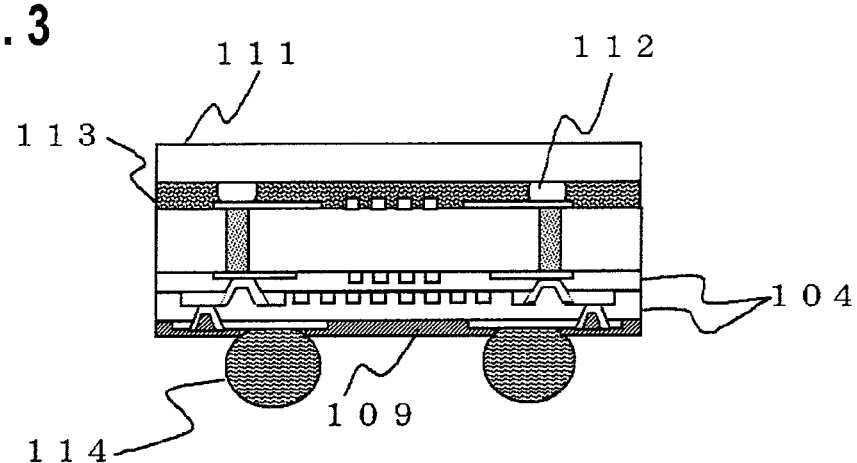
FIG. 3 is a sectional view of a flip-chip type semiconductor package to which one embodiment according to the present invention is applied.

FIG. 3 shows a sectional typical view of one embodiment of a flip-chip type semiconductor package according to the present invention. As shown in FIG. 3, the semiconductor package according to the present invention is one obtained by mounting a semiconductor chip 111 on the above substrate for mounting a semiconductor chip according to the present invention, wherein a semiconductor chip and a semiconductor connecting terminal are electrically connected by flip-chip connection using a connecting bump 112.

Moreover, in these semiconductor packages, the space between the semiconductor chip and the substrate for mounting a semiconductor chip is preferably sealed with an under-filling material 113. The thermal expansion coefficient of the under-filling material is preferably close to those of the semiconductor chip 111 and core substrate 100, though there is no limitation to it. It is more preferable that the following relationship be satisfied: (Thermal expansion coefficient of the semiconductor chip)≦(Thermal expansion coefficient of the under-filling material)≦(Thermal expansion coefficient of the core substrate). Moreover, when the semiconductor chip is mounted, an anisotropic conductive film (ACF) or an adhesive film (NCF) not containing conductive particles may be used. In this case, it is unnecessary to seal using an under-filling material, which is desirable. Moreover, if ultrasonic wave is used together when mounting the semiconductor chip, this is particularly preferable because electrical connection can be achieved at low temperatures in a short time.

Figure 4:
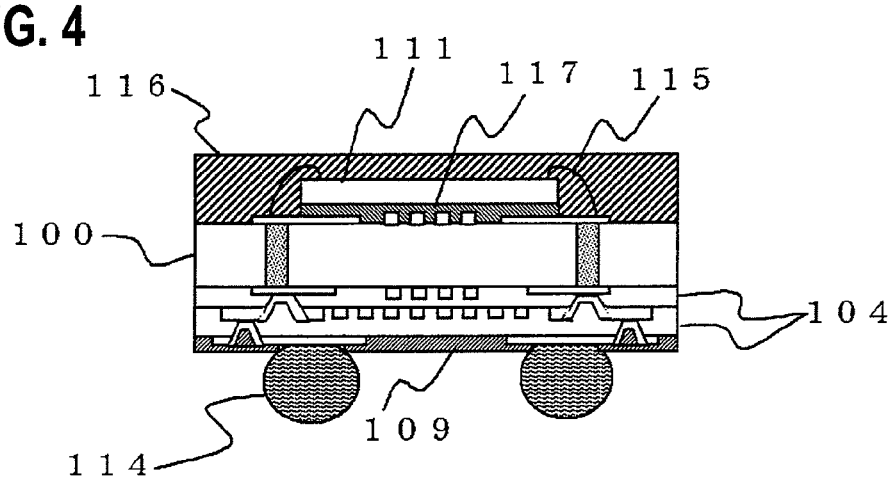
FIG. 4 is a sectional view of a wire bonding type semiconductor package to which one embodiment according to the present invention is applied.

Also, FIG. 4 shows a sectional view of an embodiment of a wire bond type semiconductor package according to the present invention. When the semiconductor chip is mounted, a die bond film 117 is more preferably used though a general die bond paste may be used. The semiconductor chip is electrically connected to the semiconductor chip connecting terminal by a wire bond using a gold wire 115. The semiconductor chip can be sealed with a semiconductor seal resin 116 by transfer-molding. As to sealing region in this case, only a necessary part, for example, only the face plane of the semiconductor chip may be sealed. However, it is preferable to seal the whole region of the semiconductor package as shown in FIG. 4. This is a particularly effective method when the substrate and the seal resin 116 are simultaneously cut by a dicer in the substrate for mounting a semiconductor chip in which plural semiconductor package areas are arranged in plural lines and plural rows.

Also, a solder ball 114 may be mounted on the external connecting terminal 107 to electrically connect to a mother board. As the solder ball, an eutectic solder or Pb-free solder is used. As a method of securing the solder ball to the external connecting terminal 107, for example, a $N_2$ reflow device or the like may be used, though there is no limitation to the method.

The plural semiconductor packages containing plural semiconductor chips mounted on the above substrate for mounting a semiconductor chip are finally cut into respective semiconductor packages by using a dicer or the like.

EXAMPLES

The present invention will be explained in detail by way of examples, which are not intended to be limiting of the invention.

Example 1

Semiconductor package samples were manufactured in the following manner to evaluate the reliability of a semiconductor package manufactured by applying the copper surface treatment of the present invention.

(Step a)

A soda glass substrate (thermal expansion coefficient: 11 ppm/° C.) of 0.4 mm in thickness was prepared as a core substrate 100. A 200 nm-thick copper thin film was formed on one surface of the substrate by sputtering, and then electroplated with copper to a thickness of 10 μm. The sputtering was carried out using an apparatus (model No. MLH-6315, manufactured by Ulvac, Inc.) in the following condition 1.

Condition 1

Current: 3.5 A

Voltage: 500 V

Flow rate of argon: 35 SCCM (0.059 Pa·m$^3$/s)

Pressure: $5 \times 10^{-3}$ Torr ($6.6 \times 10^{-1}$ Pa)

Film formation speed: 5 nm/sec.

Then, an etching resist was formed on the part to be a first wiring 106a and then the copper layer was etched by a ferric chloride etching solution and then the etching resist was removed, thereby forming the first wiring 106a (including a first interlayer connecting terminal 101 and a semiconductor chip connecting terminal).

(Step b)

A hole which was to be a 50-μm-dia IVH was formed by a laser until the hole bottom reached the first interlayer connecting terminal 101 from the side opposite to the first wiring 106a side of the glass substrate on which the first wiring 106a was formed. As the laser, a YAG laser LAVIA-UV2000 (trade name, manufactured by Sumitomo Heavy Industries Ltd.) was used to form the hole to be the IVH in the following condition: frequency: 4 kHz, number of shots: 50 and mask diameter: 0.4 mm. Then, the inside of the hole was processed by desmearing treatment. Thereafter, a conductive paste MP-200V (tradename, manufactured by Hitachi Chemical Co., Ltd.) was filled in the hole and cured at 160° C. for 30 minutes. The hole filled with the conductive paste was electrically connected to the first interlayer connecting terminal 101 on the glass substrate to form a first interlayer connecting IVH 102 (via-hole).

(Step c)

In order to electrically connect to the first interlayer connecting IVH 102 (first via-hole) formed in the (step b), a 200-nm-thick copper thin film was formed on the surface of the glass substrate on the side opposite to the first wiring 106a and then electroplated with copper to a thickness of 10 μm. The sputtering was carried out in the same manner as in the (step a).

Then, an etching resist was formed into the form of a second wiring 106b in the same manner as in the (step a) and then the copper layer was etched by a ferric chloride etching solution and then the etching resist was removed, thereby forming the second wiring 106b (including a second interlayer connecting terminal 103).

(Step d)

(Step d-1)

The surface of the wiring on the second wiring 106*b* side formed in the (step c) was dipped at 50° C. for 2 minutes in an acidic defatting solution Z-200 (trade name, manufactured by World Metal Company) adjusted to 200 ml/L, then dipped at 50° C. for 2 minutes in water to wash the surface with hot water and further washed with water for one minute. Then, the surface of the wiring was dipped in an aqueous 3.6 N sulfuric acid solution for one minute and washed with water for one minute.

(Step d-2)

The second wiring 106*b* processed through the above pretreatment was dipped at 30° C. for 3 minutes in a substitute palladium plating solution SA-100 (trade name, manufactured by Hitachi Chemical Co., Ltd.) to provide $1.0 \, \mu mol/dm^2$ of plating of palladium which is a metal nobler than copper and washed with water for one minute. Then, the second wiring 106*b* was further dipped at 50° C. for 3 minutes in an oxidation process solution obtained by adding 15 g/L of sodium chlorite to an alkaline solution containing 10 g/L of trisodium phosphate and 25 g/L of potassium hydroxide to form $0.07 \, mg/cm^2$ of copper oxide crystals on the surface of the second wiring 16*b*. After that, the second wiring 16*b* was washed with water for 5 minutes and then dried at 85° C. for 30 minutes.

(Step d-3)

Next, an interlayer insulating layer (buildup layer) 104 was formed on the second wiring 106*b* side of the substrate in the following manner. Specifically, an insulating varnish of a cyanate ester type resin composition was applied to the second wiring 106*b* side of the substrate at 1500 rpm by a spin coating method to form a resin layer of 20 μm in thickness, heated to 230° C. at a rate of 6° C./min from ambient temperature (25° C.) and kept at 230° C. for 80 minutes to heat-cure, thereby forming a 15-μm-thick buildup layer 104.

(Step e)

A hole which was to be a 50-μm-dia IVH was formed by a laser until the hole bottom reached the second interlayer connecting terminal 103 from the surface of the buildup layer 104 formed in the above (step d-3). As the laser, a YAG laser LAVIA-UV2000 (trade name, manufactured by Sumitomo Heavy Industries Ltd.) was used to form the hole to be the IVH in the following condition: frequency: 4 kHz, number of shots: 20 and mask diameter: 0.4 mm. Then, desmearing treatment was carried out. In the desmearing treatment, the substrate was dipped in a swelling solution Circuposit Holeprip 4125 (trade name, manufactured by Rohm and Haas Co.) at 80° C. for 3 minutes and then washed with water for 3 minutes. After that, the substrate was dipped in a desmearing solution Circuposit MLB Promoter 213 (trade name, manufactured by Rohm and Haas Co.) at 80° C. for 5 minutes and then washed with water for 3 minutes. Then, the substrate was dipped in a reducing solution Circuposit MLB216-4 (trade name, manufactured by Rohm and Haas Co.) at 40° C. for 3 minutes, then washed with water for 3 minutes and dried at 85° C. for 30 minutes.

(Step f)

In order to form a third wiring 106*c* and a second IVH 108 on the buildup layer 104 formed in the above (step d-3), a Ni layer (base metal) of 20 nm in thickness was formed on the buildup layer 104 by sputtering and further, a thin film copper layer of 200 nm in thickness was formed on the Ni layer to form a seed layer. The sputtering was carried out using MLH-6315, manufactured by Ulvac Corporation in the following condition 2.

Condition 2

(Ni layer)

Current: 5.0 A

Voltage: 350 V

Flow rate of argon: 35 SCCM ($0.059 \, Pa \cdot m^3/s$)

Pressure: $5 \times 10^{-3}$ Torr ($6.6 \times 10^{-1}$ Pa)

Film formation speed: 0.3 nm/sec.

(Thin film copper layer)

Current: 3.5 A

Voltage: 500 V

Flow rate of argon: 35 SCCM ($0.059 \, Pa \cdot m^3/s$)

Pressure: $5 \times 10^{-3}$ Torr ($6.6 \times 10^{-1}$ Pa)

Film formation speed: 5 nm/sec.

Next, a plating resist PMER P-LA900PM (trade name, manufactured by Tokyo Ohka Kogyo Co., Ltd.) was applied to the surface of the seed layer (thin film copper layer) by a spin coating method to form a plating resist layer of 10 μm in film thickness. Then, after the plating resist layer was exposed to light at an intensity of $1000 \, mJ/cm^2$, the substrate was dipped in a PMER developing solution P-7G at 23° C. for 6 minutes to form a resist pattern (L/S=10 μm/10 μm). Thereafter, a copper sulfate plating solution was used to carry out copper electroplating, thereby forming a third wiring 106*c* of about 5 μm in thickness. The plating resist was peeled off by dipping it in methyl ethyl ketone at ambient temperature (25° C.) for one minute. In the quick etching of the seed layer, a solution obtained by diluting CPE-700 (trade name, manufactured by Mitsubishi Gas Chemical Company, Inc) five times was used and the substrate was dipped in this solution and fluctuated at 30° C. for 30 seconds to remove the seed layer by etching, thereby forming a wiring pattern.

(Step g)

After that, the (step d) to (the step f) were repeated again, thereby forming a buildup layer and a wiring of outermost layer including an external connecting terminal 107.

Finally, a solder resist 109 was formed, and then the external connecting terminal 107 and the semiconductor chip connecting terminal were plated with gold to manufacture a fan-in type substrate for mounting a semiconductor chip for BGA as shown in FIG. 1 (sectional view of one package), FIG. 5 (plan view of one package) and FIG. 7 (whole view of a substrate for mounting a semiconductor chip).

(Step h)

A necessary number of semiconductor chips 111 formed with a connecting bump 112 were mounted on the semiconductor chip mounting area of the substrate for mounting a semiconductor chip which was manufactured by the above (step a) to (step g) by using a flip-chip bonder with applying ultrasonic wave. Moreover, an under-filling material 113 was injected into the gap between the substrate for mounting a semiconductor chip from the semiconductor chip end and then cured primarily at 80° C. for one hour and further cured at 150° C. for 4 hours in an oven. Then, a 0.45-mm-dia lead/tin eutectic solder ball 114 was fused to the external connecting terminal 107 by a $N_2$ reflow device. Finally, the substrate for mounting a semiconductor chip was cut by a dicer equipped with a 200-μm-wide blade to manufacture a semiconductor package as shown in FIG. 3.

Example 2

A fan-in type substrate for mounting a semiconductor chip for BGA and a semiconductor package were manufactured in the same manner as in Example 1 except that a reducing process was carried out, the process including washing the surface of the second wiring 106*b* with water for 5 minutes, dipping the substrate at 40° C. for 3 minutes in a reducing process solution HIST-100D (trade name, Hitachi Chemical Co., Ltd.), washing further with water for 10 minutes and drying at 85° C. for 30 minutes, after copper oxide crystals were formed on the surface of the second wiring 106*b* in the (step d-2) and before the buildup layer 104 was formed in the (step d-3).

Example 3

A fan-in type substrate for mounting a semiconductor chip for BGA and a semiconductor package were manufactured in the same manner as in Example 1 except that a coupling process was carried out, the process including washing the surface of the second wiring 106*b* with water for 5 minutes, dipping the substrate at 30° C. for 3 minutes in an aqueous solution containing 0.5% by weight of γ-aminopropyltriethoxysilane, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 4

A fan-in type substrate for mounting a semiconductor chip for BGA and a semiconductor package were manufactured in the same manner as in Example 1 except that a corrosion inhibitive process was carried out, the process including washing the surface of the second wiring 106*b* with water for 5 minutes, dipping the substrate at 25° C. for 10 minutes in an ethanol solution containing 2-amino-6-hydroxy-8-mercaptopurine (trade name, Wako Pure Chemical Industries, Ltd.) in a concentration of 10 ppm, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 5

A fan-in type substrate for mounting a semiconductor chip for BGA and a semiconductor package were manufactured in the same manner as in Example 1 except that a corrosion inhibitive process was carried out, the process including washing the surface of the second wiring 106*b* with water for 5 minutes, dipping the substrate at 25° C. for 10 minutes in an ethanol solution containing 3-amino-5-mercapto-1,2,4-triazole (trade name, Wako Pure Chemical Industries, Ltd.) in a concentration of 10 ppm, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 6

A fan-in type substrate for mounting a semiconductor chip for BGA and a semiconductor package were manufactured in the same manner as in Example 1 except that a corrosion inhibitive process was carried out, the process including washing the surface of the second wiring 106*b* with water for 5 minutes, dipping the substrate at 25° C. for 10 minutes in an ethanol solution containing 2-amino-6-hydroxy-8-mercaptopurine (trade name, Wako Pure Chemical Industries, Ltd.) in a concentration of 10 ppm, washing further with water for 1 minute and drying at 85° C. for 30 minutes, and then, coupling process was carried out, the process including dipping the substrate at 30° C. for 3 minutes in an aqueous solution containing 0.5% by weight of γ-aminopropyltriethoxysilane, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 7

A fan-in type substrate for mounting a semiconductor chip for BGA and a semiconductor package were manufactured in the same manner as in Example 1 except that a coupling process was carried out, the process including washing the surface of the second wiring 106*b* with water for 5 minutes, dipping the substrate at 30° C. for 3 minutes in an aqueous solution containing 0.5% by weight of γ-aminopropyltriethoxysilane, washing further with water for 1 minute and drying at 85° C. for 30 minutes, and then a corrosion inhibitive process was carried out, the process including dipping the substrate at 25° C. for 10 minutes in an ethanol solution containing 3-amino-5-mercapto-1,2,4-triazole (trade name, Wako Pure Chemical Industries, Ltd.) in a concentration of 10 ppm, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 8

A fan-in type substrate for mounting a semiconductor chip for BGA and a semiconductor package were manufactured in the same manner as in Example 1 except that a reducing process was carried out, the process including washing the surface of the second wiring 106*b* with water for 5 minutes, dipping the substrate at 40° C. for 3 minutes in a reducing process solution HIST-100D (trade name, Hitachi Chemical Co., Ltd.) and washing further with water for 10 minutes, and then, coupling process was carried out, the process including dipping the substrate at 30° C. for 3 minutes in an aqueous solution containing 0.5% by weight of γ-aminopropyltriethoxysilane, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 9

A fan-in type substrate for mounting a semiconductor chip for BGA and a semiconductor package were manufactured in the same manner as in Example 1 except that a reducing process was carried out, the process including washing the surface of the second wiring 106*b* with water for 5 minutes, dipping the substrate at 40° C. for 3 minutes in a reducing process solution HIST-100D (trade name, Hitachi Chemical Co., Ltd.) and washing further with water for 10 minutes, and then, a corrosion inhibitive process was carried out, the process including dipping the substrate at 25° C. for 10 minutes in an ethanol solution containing 2-amino-6-hydroxy-8-mercaptopurine (trade name, Wako Pure Chemical Industries, Ltd.) in a concentration of 10 ppm, washing further with water for 1 minute and drying at 85° C. for 30 minutes, after copper oxide crystals were formed on the surface of the second wiring 106*b* in the (step d-2) and before the buildup layer 104 was formed in the (step d-3).

Example 10

A fan-in type substrate for mounting a semiconductor chip for BGA and a semiconductor package were manufactured in the same manner as in Example 1 except that a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.) and washing further with water for 10 minutes, and then, a corrosion inhibitive process was carried out, the process including dipping the substrate at 25° C. for 10 minutes in an ethanol solution containing 3-amino-5-mercapto-1,2,4-triazole (trade name, Wako Pure Chemical Industries, Ltd.) in a concentration of 10 ppm, washing further with water for 1 minute and drying at 85° C. for 30 minutes, after copper oxide crystals were formed on the surface of the second wiring 106b in the (step d-2) and before the buildup layer 104 was formed in the (step d-3).

Example 11

A fan-in type substrate for mounting a semiconductor chip for BGA and a semiconductor package were manufactured in the same manner as in Example 1 except that a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.) and washing further with water for 10 minutes, then, a corrosion inhibitive process was carried out, the process including dipping the substrate at 25° C. for 10 minutes in an ethanol solution containing 2-amino-6-hydroxy-8-mercaptopurine (trade name, Wako Pure Chemical Industries, Ltd.) in a concentration of 10 ppm, washing further with water for 1 minute and drying at 85° C. for 30 minutes, and then, a coupling process was carried out, the process including dipping the substrate at 30° C. for 3 minutes in an aqueous solution containing 0.5% by weight of γ-aminopropyltriethoxysilane, washing further with water for 1 minute and drying at 85° C. for 30 minutes, after copper oxide crystals were formed on the surface of the second wiring 106b in the (step d-2) and before the buildup layer 104 was formed in the (step d-3).

Example 12

A fan-in type substrate for mounting a semiconductor chip for BGA and a semiconductor package were manufactured in the same manner as in Example 1 except that a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.) and washing further with water for 10 minutes, then, a coupling process was carried out, the process including dipping the substrate at 30° C. for 3 minutes in an aqueous solution containing 0.5% by weight of γ-aminopropyltriethoxysilane, washing further with water for 1 minute and drying at 85° C. for 30 minutes, and then a corrosion inhibitive process was carried out, the process including dipping the substrate at 25° C. for 10 minutes in an ethanol solution containing 3-amino-5-mercapto-1,2,4-triazole (tradename, Wako Pure Chemical Industries, Ltd.) in a concentration of 10 ppm, washing further with water for 1 minute and drying at 85° C. for 30 minutes, after copper oxide crystals were formed on the surface of the second wiring 106b in the (step d-2) and before the buildup layer 104 was formed in the (step d-3).

Example 13

A fan-in type substrate for mounting a semiconductor chip for BGA and a semiconductor package were manufactured in the same manner as in Example 1 except that a substitute gold plating solution HGS-500 (trade name, Hitachi Chemical Co., Ltd.) was used in place of the substitute palladium plating solution SA-100 (trade name, manufactured by Hitachi Chemical Co., Ltd.) used in the (step d-2), and the surface of the second wiring 106b was dipped in the substitute gold plating solution at 30° C. for one minute to plate the surface of the wiring with 1.0 μmol/dm$^2$ of gold which is a metal nobler than copper, washed with water for one minute and then dipped in an oxidation processing solution prepared by adding 15 g/L of sodium chlorite to an alkaline solution containing 10 g/L of trisodium phosphate and 25 g/L of potassium hydroxide at 50° C. for 3 minutes to form 0.03 mg/cm$^2$ of crystals of copper oxide on the surface of the second wiring 106b, and then a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.), washing further with water for 10 minutes and then, drying at 85° C. for 30 minutes.

Example 14

A fan-in type substrate for mounting a semiconductor chip for BGA and a semiconductor package were manufactured in the same manner as in Example 1 except that a substitute silver plating solution containing 7.5 g/L of silver nitrate, 75 g/L of ammonia hydroxide and 30 g/L of sodium thiosulfate pentahydrate was used in place of the substitute palladium plating solution SA-100 (trade name, manufactured by Hitachi Chemical Co., Ltd.) used in the (step d-2), and the surface of the second wiring 106b was dipped in the substitute silver plating solution at 30° C. for 20 seconds to plate the surface of the wiring with 1.0 μmol/dm$^2$ of silver which is a metal nobler than copper, washed with water for one minute and then dipped in an oxidation processing solution prepared by adding 15 g/L of sodium chlorite to an alkaline solution containing 10 g/L of trisodium phosphate and 25 g/L of potassium hydroxide at 50° C. for 3 minutes to form 0.05 mg/cm$^2$ of crystals of copper oxide on the surface of the second wiring 106b, and then a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.), washing further with water for 10 minutes, and then drying at 85° C. for 30 minutes.

Comparative Example 1

A fan-in type substrate for mounting a semiconductor chip for BGA and a semiconductor package were manufactured in the same manner as in Example 1 except that after the pretreatment in the (step d-1) of the (step d) was carried out, the surface of the second wiring 106b was dipped in the oxidation processing solution at 85° C. for 3 minutes without carrying out the substitute palladium plating in the (step d-2) to form 0.50 mg/cm² of crystals of copper oxide.

Comparative Example 2

A fan-in type substrate for mounting a semiconductor chip for BGA and a semiconductor package were manufactured in the same manner as in Example 1 except that after the pretreatment in the (step d-1) of the (step d) was carried out, the surface of the second wiring 106b was dipped in an oxidation processing solution at 85° C. for 3 minutes without carrying out the substitute palladium plating in the (step d-2) to form 0.50 mg/cm² of crystals of copper oxide, and then, a reducing process was carried out, the process including washing the surface of the second wiring 106b with water for 5 minutes, dipping the substrate at 40° C. for 3 minutes in a reducing process solution HIST-100D (trade name, Hitachi Chemical Co., Ltd.), washing further with water for 10 minutes, and then drying at 85° C. for 30 minutes.

Comparative Example 3

A fan-in type substrate for mounting a semiconductor chip for BGA and a semiconductor package were manufactured in the same manner as in Example 1 except that after the pretreatment in the (step d-1) of the (step d) was carried out, the surface of the second wiring 106b was dipped in Meck Etch Bond CZ8100 (trade name, manufactured by Meck (k.k.)) at 40° C. for one minute and 30 seconds, washed with water, dipped in an aqueous 3.6 N sulfuric acid solution at ambient temperature for 60 seconds, further washed with water for one minute and dried at 85° C. for 30 minutes without carrying out the substitute palladium plating and the oxidation processing in the (step d-2).

Comparative Example 4

A fan-in type substrate for mounting a semiconductor chip for BGA and a semiconductor package were manufactured in the same manner as in Example 1 except that after the pretreatment in the (step d-1) of the (step d) was carried out, the process of the (step d-2) was not carried out: specifically, the irregularities formation step was not carried out.

Example 15

In order to evaluate the adhesion, purity, smoothness, glossiness and surface shape of the surface of copper after the treatment of the surface of copper according to the present invention, a 18-μm-thick electrolytic copper foil GTS-18 (trade name, manufactured by Furukawa Circuit Foil Co., Ltd.) was cut into 5 sample foils of 5 cm×8 cm (for adhesive test, evaluation of the purity of the surface of copper, evaluation of the smoothness of the surface of copper, evaluation of the shape of the surface of copper and evaluation of the glossiness of the surface of copper). One surface of each electrolytic copper foil was subjected to each surface treatment (pretreatment, noble metal formation and oxidation treatment) carried out on the surface of the wiring as described in the (step d-1) and (step d-2) of Example 1 to prepare a test specimen of an electrolytic copper foil.

Example 16

A test specimen of an electrolytic copper foil was prepared in the same manner as in Example 15 except that as the surface treatment for the electrolytic copper foil, the same treatments as each surface treatment (pretreatment, noble metal formation, oxidation treatment and reducing treatment) for the surface of the wiring as described in Example 2 were carried out.

Example 17

A test specimen of an electrolytic copper foil was prepared in the same manner as in Example 15 except that as the surface treatment for the electrolytic copper foil, the same treatments as each surface treatment (pretreatment, noble metal formation, oxidation treatment and coupling treatment) for the surface of the wiring as described in Example 3 were carried out.

Example 18

A test specimen of an electrolytic copper foil was prepared in the same manner as in Example 15 except that as the surface treatment for the electrolytic copper foil, the same treatments as each surface treatment (pretreatment, noble metal formation, oxidation treatment and corrosion inhibitive treatment) for the surface of the wiring as described in Example 4 were carried out.

Example 19

A test specimen of an electrolytic copper foil was prepared in the same manner as in Example 15 except that as the surface treatment for the electrolytic copper foil, the same treatments as each surface treatment (pretreatment, noble metal formation, oxidation treatment and corrosion inhibitive treatment) for the surface of the wiring as described in Example 5 were carried out.

Example 20

A test specimen of an electrolytic copper foil was prepared in the same manner as in Example 15 except that as the surface treatment for the electrolytic copper foil, the same treatments as each surface treatment (pretreatment, noble metal formation, oxidation treatment, corrosion inhibitive treatment and coupling treatment) for the surface of the wiring as described in Example 6 were carried out.

Example 21

A test specimen of an electrolytic copper foil was prepared in the same manner as in Example 15 except that as the surface treatment for the electrolytic copper foil, the same treatments as each surface treatment (pretreatment, noble metal formation, oxidation treatment, coupling treatment and corrosion inhibitive treatment) for the surface of the wiring as described in Example 7 were carried out.

Example 22

A test specimen of an electrolytic copper foil was prepared in the same manner as in Example 15 except that as the surface treatment for the electrolytic copper foil, the same treatments as each surface treatment (pretreatment, noble metal formation, oxidation treatment, reducing treatment and coupling treatment) for the surface of the wiring as described in Example 8 were carried out.

Example 23

A test specimen of an electrolytic copper foil was prepared in the same manner as in Example 15 except that as the surface treatment for the electrolytic copper foil, the same treatments as each surface treatment (pretreatment, noble metal formation, oxidation treatment, reducing treatment and corrosion inhibitive treatment) for the surface of the wiring as described in Example 9 were carried out.

Example 24

A test specimen of an electrolytic copper foil was prepared in the same manner as in Example 15 except that as the surface treatment for the electrolytic copper foil, the same treatments as each surface treatment (pretreatment, noble metal formation, oxidation treatment, reducing treatment and corrosion inhibitive treatment) for the surface of the wiring as described in Example 10 were carried out.

Example 25

A test specimen of an electrolytic copper foil was prepared in the same manner as in Example 15 except that as the surface treatment for the electrolytic copper foil, the same treatments as each surface treatment (pretreatment, noble metal formation, oxidation treatment, reducing treatment, corrosion inhibitive treatment and coupling treatment) for the surface of the wiring as described in Example 11 were carried out.

Example 26

A test specimen of an electrolytic copper foil was prepared in the same manner as in Example 15 except that as the surface treatment for the electrolytic copper foil, the same treatments as each surface treatment (pretreatment, noble metal formation, oxidation treatment, reducing treatment, coupling treatment and corrosion inhibitive treatment) for the surface of the wiring as described in Example 12 were carried out.

Example 27

A test specimen of an electrolytic copper foil was prepared in the same manner as in Example 15 except that as the surface treatment for the electrolytic copper foil, the same treatments as each surface treatment (pretreatment, noble metal (gold) formation, oxidation treatment and reducing treatment) for the surface of the wiring as described in Example 13 were carried out.

Example 28

A test specimen of an electrolytic copper foil was prepared in the same manner as in Example 15 except that as the surface treatment for the electrolytic copper foil, the same treatments as each surface treatment (pretreatment, noble metal (silver) formation, oxidation treatment and reducing treatment) for the surface of the wiring as described in Example 14 were carried out.

Comparative Example 5

A test specimen of an electrolytic copper foil was prepared in the same manner as in Example 15 except that as the surface treatment for the electrolytic copper foil, the same treatments as each surface treatment (pretreatment and oxidation treatment) for the surface of the wiring as described in Comparative Example 1 were carried out.

Comparative Example 6

A test specimen of an electrolytic copper foil was prepared in the same manner as in Example 15 except that as the surface treatment for the electrolytic copper foil, the same treatments as each surface treatment (pretreatment, oxidation treatment and reducing treatment) for the surface of the wiring as described in Comparative Example 2 were carried out.

Comparative Example 7

A test specimen of an electrolytic copper foil was prepared in the same manner as in Example 15 except that as the surface treatment for the electrolytic copper foil, the same treatments as each surface treatment (pretreatment and etching treatment) for the surface of the wiring as described in Comparative Example 3 were carried out.

Comparative Example 8

A test specimen of an electrolytic copper foil was prepared in the same manner as in Example 15 except that as the surface treatment for the electrolytic copper foil, the same treatments as each surface treatment (pretreatment and omitting irregularities formation treatment) for the surface of the wiring as described in Comparative Example 4 were carried out.

Example 29

A substrate for evaluation as shown below was manufactured to measure the insulating resistance between wires and PCT resistance for evaluating the method of treating the surface of copper according to the present invention.

(Step a')

A soda glass substrate (thermal expansion coefficient: 11 ppm/° C.) of 0.4 mm in thickness was prepared as a core substrate 100 as shown in FIGS. 9 and 10 and an interlayer insulating layer 104 was formed on one surface in the following manner. Specifically, an insulating varnish of a cyanate ester type resin composition was applied to the glass substrate at 1500 rpm by a spin coating method to form a resin layer of 20 μm in thickness. The resin layer was heated to 230° C. at a rate of 6° C./min from ambient temperature (25° C.) and kept at 230° C. for 80 minutes to heat-cure, thereby forming an interlayer insulating layer 104. After that, only a 200-nm-thick copper thin film 118 was formed by the (step a) of Example 1.

Next, a plating resist PMER P-LA900PM (trade name, manufactured by Tokyo Ohka Kogyo Co., Ltd.) was applied to the copper foil film by a spin coating method to form a plating resist layer of 10 μm in thickness. Then, the plating resist layer was exposed to light at a dose of 1000 mJ/cm$^2$ and then dipped in a PMER developing solution P-7G at 23° C. for 6 minutes to form a resist pattern 119. Thereafter, a copper sulfate plating solution was used to carry out copper electroplating, thereby forming a wiring 106 of about 5 μm in thickness. The plating resist was peeled off by dipping it in methyl ethyl ketone at ambient temperature (25° C.) for one minute. In the quick etching of the seed layer, a solution obtained by diluting CPE-700 (trade name, manufactured by Mitsubishi Gas Chemical Company, Inc) five times was used and the substrate was dipped in this solution and fluctuated at 30° C. for 30 seconds to remove the seed layer by etching, thereby forming a wiring 106.

(Step d')

The wiring 106 formed in the above (step a') was subjected to each surface treatment (pretreatment, noble metal formation and oxidation treatment) as described in the (step d-1) and (step d-2) of Example 1. Then, an interlayer insulating layer (buildup layer) 104 shown in FIG. 9 and a solder resist 109 shown in FIG. 10 were respectively formed to manufacture 32 substrates for evaluation of L/S=5 μm/5 μm as shown in FIGS. 11 and 32 substrates for evaluation of L/S=10 μm/10 μm as shown in FIG. 12.

Example 30

A substrate for evaluation was manufactured in the same manner as in Example 29 except that as each surface treatment in the above (step d'), the same treatments as each surface treatment (pretreatment, noble metal formation, oxidation treatment and reducing treatment) for the surface of the wiring as described in Example 2 were carried out.

Example 31

A substrate for evaluation was manufactured in the same manner as in Example 29 except that as each surface treatment in the above (step d'), the same treatments as each surface treatment (pretreatment, noble metal formation, oxidation treatment and coupling treatment) for the surface of the wiring as described in Example 3 were carried out.

Example 32

A substrate for evaluation was manufactured in the same manner as in Example 29 except that as each surface treatment in the above (step d'), the same treatments as each surface treatment (pretreatment, noble metal formation, oxidation treatment and corrosion inhibitive treatment) for the surface of the wiring as described in Example 4 were carried out.

Example 33

A substrate for evaluation was manufactured in the same manner as in Example 29 except that as each surface treatment in the above (step d'), the same treatments as each surface treatment (pretreatment, noble metal formation, oxidation treatment and corrosion inhibitive treatment) for the surface of the wiring as described in Example 5 were carried out.

Example 34

A substrate for evaluation was manufactured in the same manner as in Example 29 except that as each surface treatment in the above (step d'), the same treatments as each surface treatment (pretreatment, noble metal formation, oxidation treatment, corrosion inhibitive treatment and coupling treatment) for the surface of the wiring as described in Example 6 were carried out.

Example 35

A substrate for evaluation was manufactured in the same manner as in Example 29 except that as each surface treatment in the above (step d'), the same treatments as each surface treatment (pretreatment, noble metal formation, oxidation treatment, coupling treatment and corrosion inhibitive treatment) for the surface of the wiring as described in Example 7 were carried out.

Example 36

A substrate for evaluation was manufactured in the same manner as in Example 29 except that as each surface treatment in the above (step d'), the same treatments as each surface treatment (pretreatment, noble metal formation, oxidation treatment, reducing treatment and coupling treatment) for the surface of the wiring as described in Example 8 were carried out.

Example 37

A substrate for evaluation was manufactured in the same manner as in Example 29 except that as each surface treatment in the above (step d'), the same treatments as each surface treatment (pretreatment, noble metal formation, oxidation treatment, reducing treatment and corrosion inhibitive treatment) for the surface of the wiring as described in Example 9 were carried out.

Example 38

A substrate for evaluation was manufactured in the same manner as in Example 29 except that as each surface treatment in the above (step d'), the same treatments as each surface treatment (pretreatment, noble metal formation, oxidation treatment, reducing treatment and corrosion inhibitive treatment) for the surface of the wiring as described in Example 10 were carried out.

Example 39

A substrate for evaluation was manufactured in the same manner as in Example 29 except that as each surface treatment in the above (step d'), the same treatments as each surface treatment (pretreatment, noble metal formation, oxidation treatment, reducing treatment, corrosion inhibitive treatment and coupling treatment) for the surface of the wiring as described in Example 11 were carried out.

Example 40

A substrate for evaluation was manufactured in the same manner as in Example 29 except that as each surface treatment in the above (step d'), the same treatments as each surface treatment (pretreatment, noble metal formation, oxidation treatment, reducing treatment, coupling treatment and corrosion inhibitive treatment) for the surface of the wiring as described in Example 12 were carried out.

Example 41

A substrate for evaluation was manufactured in the same manner as in Example 29 except that as each surface treatment in the above (step d'), the same treatments as each surface treatment (pretreatment, noble metal (gold) formation, oxidation treatment and reducing treatment) for the surface of the wiring as described in Example 13 were carried out.

Example 42

A substrate for evaluation was manufactured in the same manner as in Example 29 except that as each surface treatment in the above (step d'), the same treatments as each surface treatment (pretreatment, noble metal (silver) formation, oxidation treatment and reducing treatment) for the surface of the wiring as described in Example 14 were carried out.

Comparative Example 9

A substrate for evaluation was manufactured in the same manner as in Example 29 except that as each surface treatment in the above (step d'), the same treatments as each surface treatment (pretreatment and oxidation treatment) for the surface of the wiring as described in Comparative Example 1 were carried out.

Comparative Example 10

A substrate for evaluation was manufactured in the same manner as in Example 29 except that as each surface treatment in the above (step d'), the same treatments as each surface treatment (pretreatment, oxidation treatment and reducing treatment) for the surface of the wiring as described in Comparative Example 2 were carried out.

Comparative Example 11

A substrate for evaluation was manufactured in the same manner as in Example 29 except that as each surface treatment in the above (step d'), the same treatments as each surface treatment (pretreatment and etching treatment) for the surface of the wiring as described in Comparative Example 3 were carried out.

Comparative Example 12

A substrate for evaluation was manufactured in the same manner as in Example 29 except that as each surface treatment in the above (step d'), the same treatments as each surface treatment (pretreatment and omitting irregularities formation treatment) for the surface of the wiring as described in Comparative Example 4 were carried out.

Example 43

The following substrate for evaluation was manufactured to evaluate resist pattern forming ability and wiring forming ability when the copper surface treatment according to the present invention used as a pretreatment for the formation of a resist pattern.

(Step a')

A soda glass substrate (thermal expansion coefficient: 11 ppm/° C.) of 0.4 mm in thickness was prepared as a core substrate 100 as shown in FIGS. 9 and 10 and an interlayer insulating layer 104 was formed on one surface in the following manner. Specifically, an insulating varnish of a cyanate ester type resin composition was applied to the glass substrate at 1500 rpm by a spin coating method to form a resin layer of 20 μm in thickness. The resin layer was heated to 230° C. at a rate of 6° C./min from ambient temperature (25° C.) and kept at 230° C. for 80 minutes to heat-cure, thereby forming an interlayer insulating layer 104. After that, only a copper thin film 118 was formed by the (step a) of Example 1.

Moreover, the copper thin film 118 was subjected to each surface treatment (pretreatment, noble metal formation and oxidation treatment) as described in the (step d-1) and (step d-2) of Example 1.

Next, a plating resist PMER P-LA900PM (trade name, manufactured by Tokyo Ohka Kogyo Co., Ltd.) was applied to the copper foil film subjected to copper surface treatment, by a spin coating method to form a plating resist layer of 10 μm in thickness. Then, the plating resist layer was exposed to light at a dose of 1000 mJ/cm$^2$ and then dipped in a PMER developing solution P-7G at 23° C. for 6 minutes to form a resist pattern 119. Thereafter, a copper sulfate plating solution was used to carry out copper electroplating, thereby forming a wiring 106 of about 5 μm in thickness. The plating resist was peeled off by dipping it in methyl ethyl ketone at ambient temperature (25° C.) for one minute. In the quick etching of the seed layer, a solution obtained by diluting CPE-700 (trade name, manufactured by Mitsubishi Gas Chemical Company, Inc.) five times was used and the substrate was dipped in this solution and fluctuated at 30° C. for 30 seconds to remove the seed layer by etching, thereby forming a wiring 106 to manufacture 32 substrates for evaluation of L/S=5 μm/5 μm as shown in FIGS. 11 and 32 substrates for evaluation of L/S=10 μm/10 μm as shown in FIG. 12.

Example 44

A substrate for evaluation was manufactured in the same manner as in Example 43 except that as each surface treatment in the above (step a'), the same surface treatments as each surface treatment (pretreatment, noble metal formation, oxidation treatment and reducing treatment) for the surface of the wiring as described in Example 2 were carried out.

Example 45

A substrate for evaluation was manufactured in the same manner as in Example 43 except that as each surface treatment in the above (step a'), the same surface treatments as each surface treatment (pretreatment, noble metal formation, oxidation treatment and coupling treatment) for the surface of the wiring as described in Example 3 were carried out.

Example 46

A substrate for evaluation was manufactured in the same manner as in Example 43 except that as each surface treatment in the above (step a'), the same surface treatments as each surface treatment (pretreatment, noble metal formation, oxidation treatment and corrosion inhibitive treatment) for the surface of the wiring as described in Example 4 were carried out.

Example 47

A substrate for evaluation was manufactured in the same manner as in Example 43 except that as each surface treatment in the above (step a'), the same surface treatments as each surface treatment (pretreatment, noble metal formation, oxidation treatment and corrosion inhibitive treatment) for the surface of the wiring as described in Example 5 were carried out.

Example 48

A substrate for evaluation was manufactured in the same manner as in Example 43 except that as each surface treatment in the above (step a'), the same surface treatments as each surface treatment (pretreatment, noble metal formation, oxidation treatment, corrosion inhibitive treatment and coupling treatment) for the surface of the wiring as described in Example 6 were carried out.

Example 49

A substrate for evaluation was manufactured in the same manner as in Example 43 except that as each surface treatment in the above (step a'), the same surface treatments as each surface treatment (pretreatment, noble metal formation, oxidation treatment, coupling treatment and corrosion inhibitive treatment) for the surface of the wiring as described in Example 7 carried out.

Example 50

A substrate for evaluation was manufactured in the same manner as in Example 43 except that as each surface treatment in the above (step a'), the same surface treatments as each surface treatment (pretreatment, noble metal formation, oxidation treatment, reducing treatment and coupling treatment) for the surface of the wiring as described in Example 8 carried out.

Example 51

A substrate for evaluation was manufactured in the same manner as in Example 43 except that as each surface treatment in the above (step a'), the same surface treatments as each surface treatment (pretreatment, noble metal formation, oxidation treatment, reducing treatment and corrosion inhibitive treatment) for the surface of the wiring as described in Example 9 were carried out.

Example 52

A substrate for evaluation was manufactured in the same manner as in Example 43 except that as each surface treatment in the above (step a'), the same surface treatments as each surface treatment (pretreatment, noble metal formation, oxidation treatment, reducing treatment and corrosion inhibitive treatment) for the surface of the wiring as described in Example 10 carried out.

Example 53

A substrate for evaluation was manufactured in the same manner as in Example 43 except that as each surface treatment in the above (step a'), the same surface treatments as each surface treatment (pretreatment, noble metal formation, oxidation treatment, reducing treatment, corrosion inhibitive treatment and coupling treatment) for the surface of the wiring as described in Example 11 carried out.

Example 54

A substrate for evaluation was manufactured in the same manner as in Example 43 except that as each surface treatment in the above (step a'), the same surface treatments as each surface treatment (pretreatment, noble metal formation, oxidation treatment, reducing treatment, coupling treatment and corrosion inhibitive treatment) for the surface of the wiring as described in Example 12 were carried out.

Example 55

A substrate for evaluation was manufactured in the same manner as in Example 43 except that as each surface treatment in the above (step a'), the same surface treatments as each surface treatment (pretreatment, noble metal (gold) formation, oxidation treatment and reducing treatment) for the surface of the wiring as described in Example 13 carried out.

Example 56

A substrate for evaluation was manufactured in the same manner as in Example 43 except that as each surface treatment in the above (step a'), the same surface treatments as each surface treatment (pretreatment, noble metal (silver) formation, oxidation treatment and reducing treatment) for the surface of the wiring as described in Example 14 were carried out.

Comparative Example 13

A substrate for evaluation was manufactured in the same manner as in Example 43 except that as each surface treatment in the above (step a'), the same surface treatments as each surface treatment (pretreatment and oxidation treatment) for the surface of the wiring as described in Comparative Example 1 were carried out.

Comparative Example 14

A substrate for evaluation was manufactured in the same manner as in Example 43 except that as each surface treatment in the above (step a'), the same surface treatments as each surface treatment (pretreatment, oxidation treatment and reducing treatment) for the surface of the wiring as described in Comparative Example 2 were carried out.

Comparative Example 15

A substrate for evaluation was manufactured in the same manner as in Example 43 except that as each surface treatment in the above (step a'), the same surface treatments as each surface treatment (pretreatment and etching treatment) for the surface of the wiring as described in Comparative Example 3 were carried out.

Comparative Example 16

A substrate for evaluation was manufactured in the same manner as in Example 43 except that as each surface treatment in the above (step a'), the same surface treatments as each surface treatment (pretreatment and omitting irregularities formation treatment) for the surface of the wiring as described in Comparative Example 4 were carried out.

Example 57

The following substrate for evaluation was manufactured to make evaluation as to whether a pink ring appeared or not in relation to the surface treatment of copper according to the present invention.

A copper thin film 118 formed in the same manner as in the (step a') of Example 43 was electroplated and then subjected to each surface treatment (pretreatment, noble metal formation and oxidation treatment) of the (step a'). Then, without carrying out the process of forming wiring (resist application, exposure, developing, electroplating, peeling of a resist and etching), GXA-67N (tradename, Hitachi Chemical Co., Ltd.) which was a prepreg obtained by impregnating a glass cloth with a cyanate ester type resin composition was overlapped on the surface of the above surface-treated copper, heated to 230° C. at a rate of 6° C./min from ambient temperature (25° C.) under a pressure of 3.0 MPa and kept at 230° C. for one hour to laminate the prepreg on the surface of copper by sticking.

Then, holes having a hole diameter of 0.1 mm, 0.2 mm and 0.3 mm (20 holes each) were formed to the laminated body obtained above with the laser to manufacture a substrate for evaluation as to whether a pink ring appeared or not.

Example 58

A substrate for evaluation was manufactured in the same manner as in Example 57 except that as each surface treatment in the above (step a'), the same treatments as each surface treatment (pretreatment, noble metal formation, oxidation treatment and reducing treatment) for the surface of the wiring as described in Example 2 were carried out.

Example 59

A substrate for evaluation was manufactured in the same manner as in Example 57 except that as each surface treatment in the above (step a'), the same treatments as each surface treatment (pretreatment, noble metal formation, oxidation treatment and coupling treatment) for the surface of the wiring as described in Example 3 were carried out.

Example 60

A substrate for evaluation was manufactured in the same manner as in Example 57 except that as each surface treatment in the above (step a'), the same treatments as each surface treatment (pretreatment, noble metal formation, oxidation treatment and corrosion inhibitive treatment) for the surface of the wiring as described in Example 4 were carried out.

Example 61

A substrate for evaluation was manufactured in the same manner as in Example 57 except that as each surface treatment in the above (step a'), the same treatments as each surface treatment (pretreatment, noble metal formation, oxidation treatment and corrosion inhibitive treatment) for the surface of the wiring as described in Example 5 were carried out.

Example 62

A substrate for evaluation was manufactured in the same manner as in Example 57 except that as each surface treatment in the above (step a'), the same treatments as each surface treatment (pretreatment, noble metal formation, oxidation treatment, corrosion inhibitive treatment and coupling treatment) for the surface of the wiring as described in Example 6 were carried out.

Example 63

A substrate for evaluation was manufactured in the same manner as in Example 57 except that as each surface treatment in the above (step a'), the same treatments as each surface treatment (pretreatment, noble metal formation, oxidation treatment, reducing treatment, coupling treatment and corrosion inhibitive treatment) for the surface of the wiring as described in Example 7 were carried out.

Example 64

A substrate for evaluation was manufactured in the same manner as in Example 57 except that as each surface treatment in the above (step a'), the same treatments as each surface treatment (pretreatment, noble metal formation, oxidation treatment, reducing treatment and coupling treatment) for the surface of the wiring as described in Example 8 were carried out.

Example 65

A substrate for evaluation was manufactured in the same manner as in Example 57 except that as each surface treatment in the above (step a'), the same treatments as each surface treatment (pretreatment, noble metal formation, oxidation treatment, reducing treatment and corrosion inhibitive treatment) for the surface of the wiring as described in Example 9 were carried out.

Example 66

A substrate for evaluation was manufactured in the same manner as in Example 57 except that as each surface treatment in the above (step a'), the same treatments as each surface treatment (pretreatment, noble metal formation, oxidation treatment, reducing treatment and corrosion inhibitive treatment) for the surface of the wiring as described in Example 10 were carried out.

Example 67

A substrate for evaluation was manufactured in the same manner as in Example 57 except that as each surface treatment in the above (step a'), the same treatments as each surface treatment (pretreatment, noble metal formation, oxidation treatment, reducing treatment, corrosion inhibitive treatment and coupling treatment) for the surface of the wiring as described in Example 11 were carried out.

Example 68

A substrate for evaluation was manufactured in the same manner as in Example 57 except that as each surface treatment in the above (step a' the same treatments as each surface treatment (pretreatment, noble metal formation, oxidation treatment, reducing treatment, coupling treatment and corrosion inhibitive treatment) for the surface of the wiring as described in Example 12 were carried out.

Example 69

A substrate for evaluation was manufactured in the same manner as in Example 57 except that as each surface treatment in the above (step a'), the same treatments as each surface treatment (pretreatment, noble metal (gold) formation, oxidation treatment and reducing treatment) for the surface of the wiring as described in Example 13 were carried out.

Example 70

A substrate for evaluation was manufactured in the same manner as in Example 57 except that as each surface treatment in the above (step a'), the same treatments as each surface treatment (pretreatment, noble metal (silver) formation, oxidation treatment and reducing treatment) for the surface of the wiring as described in Example 14 were carried out.

Comparative Example 17

A substrate for evaluation was manufactured in the same manner as in Example 57 except that as each surface treatment in the above (step a'), the same treatments as each surface treatment (pretreatment and oxidation treatment) for the surface of the wiring as described in Comparative Example 1 were carried out.

Comparative Example 18

A substrate for evaluation was manufactured in the same manner as in Example 57 except that as each surface treatment in the above (step a'), the same treatments as each surface treatment (pretreatment, oxidation treatment and reducing treatment) for the surface of the wiring as described in Comparative Example 2 were carried out.

Comparative Example 19

A substrate for evaluation was manufactured in the same manner as in Example 57 except that as each surface treatment in the above (step a'), the same treatments as each surface treatment (pretreatment and etching treatment) for the surface of the wiring as described in Comparative Example 3 were carried out.

Comparative Example 20

A substrate for evaluation was manufactured in the same manner as in Example 57 except that as each surface treatment in the above (step a'), the same treatments as each surface treatment (pretreatment and omitting irregularities formation treatment) for the surface of the wiring as described in Comparative Example 4 were carried out.

Example 71

The following substrate for evaluation was manufactured to evaluate the appearance when the substrate is plated with gold according to the surface treatment of copper according to the present invention.

The (step a) to the (step f) shown in Example 2 were carried out and the (step d) to the (step f) were repeated once in the subsequent (step g) to further form a buildup layer 104 and an outermost wiring layer including an external connecting terminal 107.

Next, the wiring formed above was subjected to each surface treatment (pretreatment, noble metal formation and oxidation treatment) described in the (step d-1) and (step d-2) of Example 1. Then, a solder resist 109 was formed and the external connecting terminal 107 part was plated with gold to manufacture a fan-in type substrate for mounting a semiconductor chip for BGA (substrates for evaluation) as shown in FIG. 1 (sectional view of a package), FIG. 5 (plan view of a package) and FIG. 7 (whole view of a substrate for mounting a semiconductor chip).

The above gold plating treatment was carried out according to the following procedures (1) to (4).

(1) The substrate for evaluation obtained after the solder resist 109 was formed was dipped in an acidic defatting solution Z-200 (trade name, manufactured by World Metal) adjusted to 200 ml/L with water, at a liquid temperature of 50° C. for 2 minutes, dipped in 50° C. water for 2 minutes to thereby washing the substrate with hot water and then further washed with water for one minute.

(2) Then, the substrate was dipped in an aqueous 3.6N sulfuric acid solution for one minute, washed with water for one minute, then dipped in a substitute palladium plating solution SA-100 (trade name, manufactured by Hitachi Chemical Co., Ltd.) at 30° C. for 3 minutes to selectively provide palladium to the external connecting terminal 107 part and washed with water for one minute.

(3) Then, the substrate was dipped in an electroless nickel plating solution NIPS-100 (trade name, manufactured by Hitachi Chemical Co., Ltd.) at 80° C. for 15 minutes to selectively provide nickel of 5 μm in thickness to the external connecting terminal 107 part, followed by washing with water for one minute.

(4) Then, the substrate was dipped in a substitute gold plating solution HGS-500 (trade name, manufactured by Hitachi Chemical Co., Ltd.) at 85° C. for 10 minutes to selectively provide gold to the external connecting terminal 107 part, washed with water for one minute, then dipped in an electroless gold plating solution HGS-2000 (trade name, manufactured by Hitachi Chemical Co., Ltd.) at 60° C. for 40 minutes to selectively provide gold of 0.5 μm in thickness to the external connecting terminal part, washed with water for 5 minutes and dried at 85° C. for 30 minutes.

Example 72

A substrate for evaluation was manufactured in the same manner as in Example 71 except that as each surface treatment in the above (step g), the same treatments as each surface treatment (pretreatment, noble metal formation, oxidation treatment and reducing treatment) for the surface of the wiring as described in Example 2 were carried out.

Example 73

A substrate for evaluation was manufactured in the same manner as in Example 71 except that as each surface treatment in the above (step g), the same treatments as each surface treatment (pretreatment, noble metal formation, oxidation treatment and coupling treatment) for the surface of the wiring as described in Example 3 were carried out.

Example 74

A substrate for evaluation was manufactured in the same manner as in Example 71 except that as each surface treatment in the above (step g), the same treatments as each surface treatment (pretreatment, noble metal formation, oxidation treatment and corrosion inhibitive treatment) for the surface of the wiring as described in Example 4 were carried out.

Example 75

A substrate for evaluation was manufactured in the same manner as in Example 71 except that as each surface treatment in the above (step g), the same treatments as each surface treatment (pretreatment, noble metal formation, oxidation treatment and corrosion inhibitive treatment) for the surface of the wiring as described in Example 5 were carried out.

Example 76

A substrate for evaluation was manufactured in the same manner as in Example 71 except that as each surface treatment in the above (step g), the same treatments as each surface treatment (pretreatment, noble metal formation, oxidation treatment, corrosion inhibitive treatment and coupling treatment) for the surface of the wiring as described in Example 6 were carried out.

Example 77

A substrate for evaluation was manufactured in the same manner as in Example 71 except that as each surface treatment in the above (step g), the same treatments as each surface treatment (pretreatment, noble metal formation, oxidation treatment, coupling treatment and corrosion inhibitive treatment) for the surface of the wiring as described in Example 7 were carried out.

Example 78

A substrate for evaluation was manufactured in the same manner as in Example 71 except that as each surface treatment in the above (step g), the same treatments as each surface treatment (pretreatment, noble metal formation, oxidation treatment, reducing treatment and coupling treatment) for the surface of the wiring as described in Example 8 were carried out.

Example 79

A substrate for evaluation was manufactured in the same manner as in Example 71 except that as each surface treatment in the above (step g), the same treatments as each surface treatment (pretreatment, noble metal formation, oxidation treatment, reducing treatment and corrosion inhibitive treatment) for the surface of the wiring as described in Example 9 were carried out.

Example 80

A substrate for evaluation was manufactured in the same manner as in Example 71 except that as each surface treatment in the above (step g), the same treatments as each surface treatment (pretreatment, noble metal formation, oxidation treatment, reducing treatment and corrosion inhibitive treatment) for the surface of the wiring as described in Example 10 were carried out.

Example 81

A substrate for evaluation was manufactured in the same manner as in Example 71 except that as each surface treatment in the above (step g), the same treatments as each surface treatment (pretreatment, noble metal formation, oxidation treatment, reducing treatment, corrosion inhibitive treatment and coupling treatment) for the surface of the wiring as described in Example 11 were carried out.

Example 82

A substrate for evaluation was manufactured in the same manner as in Example 71 except that as each surface treatment in the above (step g), the same treatments as each surface treatment (pretreatment, noble metal formation, oxidation treatment, reducing treatment, coupling treatment and corrosion inhibitive treatment) for the surface of the wiring as described in Example 12 were carried out.

Example 83

A substrate for evaluation was manufactured in the same manner as in Example 71 except that as each surface treatment in the above (step g), the same treatments as each surface treatment (pretreatment, noble metal (gold) formation, oxidation treatment and reducing treatment) for the surface of the wiring as described in Example 13 were carried out.

Example 84

A substrate for evaluation was manufactured in the same manner as in Example 71 except that as each surface treatment in the above (step g), the same treatments as each surface treatment (pretreatment, noble metal (silver) formation, oxidation treatment and reducing treatment) for the surface of the wiring as described in Example 14 were carried out.

Comparative Example 21

A substrate for evaluation was manufactured in the same manner as in Example 71 except that as each surface treatment in the above (step g), the same treatments as each surface treatment (pretreatment and oxidation treatment) for the surface of the wiring as described in Comparative Example 1 were carried out.

Comparative Example 22

A substrate for evaluation was manufactured in the same manner as in Example 71 except that as each surface treatment in the above (step g), the same treatments as each surface treatment (pretreatment, oxidation treatment and reducing treatment) for the surface of the wiring as described in Comparative Example 2 were carried out.

Comparative Example 23

A substrate for evaluation was manufactured in the same manner as in Example 71 except that as each surface treatment in the above (step g), the same treatments as each surface treatment (pretreatment and etching treatment) for the surface of the wiring as described in Comparative Example 3 were carried out.

Comparative Example 24

A substrate for evaluation was manufactured in the same manner as in Example 71 except that as each surface treatment in the above (step g), the same treatments as each surface treatment (pretreatment and omitting irregularities formation treatment) for the surface of the wiring as described in Comparative Example 4 were carried out.

These samples for various tests which were manufactured in the above manner were subjected to each evaluation test made in the following manner.

(Reliability Test for a Semiconductor Package)

22 semiconductor package samples described in each of Examples 1 to 14 and Comparative Examples 1 to 4 were subjected to moisture absorption treatment. Then, each sample was made to flow through a reflow furnace (ultimate temperature: 240° C.) 2 min length at a rate of 0.5 m/min.) to carry out reflow treatment. Thereafter, each sample was examined as to whether cracks occurred or not and the case where cracks occurred was defined as NG. The results are shown in Table 1.

Each of 22 semiconductor package samples was mounted on a mother board of 0.8 mm in thickness and subjected to a temperature cycle test carried out in the condition of −55° C., 30 minutes and 125° C., 30 minutes to measure the conduction resistance of the wiring in 500th cycle, 1000th cycle and 1500th cycle by using Multimeter 3457A manufactured by Hewlett-Packard. The case where the measured resistance varied by 10% or more from the initial resistance was defined as NG. The results are shown in Table 1. However, with regard to Comparative Example 3, the accuracy of wiring could not be maintained and therefore, a test substrate could not be manufactured.

(Adhesive Test)

One surface of 0.8-mm-thick MCL-LX-67 (trade name, manufactured by Hitachi Chemical Co., Ltd.) which was a double-sided copper clad laminate of glass cloth impregnated with a cyanate ester type resin composition, which could be used as a multilayer material having a low dielectric dissipation factor and high heat resistance, was roughened using a chemical etching roughening solution HIST-7300 (manufactured by Hitachi Chemical Co., Ltd.), thereby increasing the roughness of the surface of copper to a Rz of 3.5 μm. Thereafter, GXA-67N (trade name, Hitachi Chemical Co., Ltd.) which was a prepreg obtained by impregnating glass cloth with a cyanate ester type resin composition was laminated on the copper surface having a Rz of 3.5 μm. Moreover, one electrolytic copper foil manufactured in each of Examples 15 to 28 and Comparative Examples 5 to 8 was laminated as the outermost layer, heated to 230° C. at a rate of 6° C./min from ambient temperature (25° C.) under a pressure of 3.0 MPa and kept at 230° C. for one hour to obtain a laminate, thereby manufacturing an adhesion test substrate. It is to be noted that the above electrolytic copper foil was stuck to the insulating layer (prepreg) on the side subjected to various surface treatments.

With regard to each adhesion test substrate obtained above, its adhesions in its initial stage (0 hour) and after allowed to stand at 150° C. for 120 hours and 240 hours were measured. The peel strength (N/m) that was the index of the above adhesion was measured using a Rheo Meter NRM-3002D-H (trade name, manufactured by Fudo Kogyo (k.k.)), wherein the electrolytic copper foil was peeled from the substrate in a direction perpendicular to the substrate at a rate of 50 mm/min. The case where the peel strength was 300 N/m or more was rated as ○ and the case where the peel strength was less than 300 N/m was rated as X. The results are shown in FIG. 2.

(Test of Evaluation of Copper Surface Purity)

The surface-treated side of each electrolytic copper foil manufactured in Examples 15 to 28 and Comparative Examples 5 to 8 was extracted with 20 ml of pure water at 85° C. for one hour to qualitatively analyze cations and anions in the extract by ion chromatograph. The ion chromatograph was carried out using DX-500 manufactured by Dionex in the following condition 2.

Condition 2

Cation measuring condition

Diluent: 8 mmol/L-methanesulfonic acid

Amount to be injected: 100 μL

Separating column: 2 mmϕ×250 mm IonPac CS14

Detector: Electric conductor

Anion measuring condition

Diluent: Mixed solution of 2.7 mmol/L of sodium carbonate and 0.3 mmol/L of sodium bicarbonate Amount to be injected: 500 μl Separating column: 4 mmϕ×200 mm IonPac AS12A Detector: Electric conductor Moreover, nitric acid was added to the above extract to quantitatively analyze metal ions by an ICP emission spectroscopic analysis. The ICP emission spectroscopic method was carried out using SPS3000 manufactured by SII Nanotechnology. As to each cation, anion and each metal ion which are the degree of detergency, the case where the amount of each ion to be detected showed 1 μg/sheet or more was rated as +++, the case where the amount of each ion to be detected showed 0.1 μg/sheet or more and less than 1 μg/sheet was rated as ++, the case where the amount of each ion to be detected showed 0.04 μg/sheet or more and less than 0.1 μg/sheet was rated as + and the case where the amount of each ion to be detected showed less than 0.04 μg/sheet was rated as −. The results are shown in Table 3.

(Test for Evaluation of the Smoothness of Copper Surface)

The surface roughness (Rz) of the surface-treated side of each electrolytic copper foil manufactured in Examples 15 to 28 and Comparative Examples 5 to 8 was measured by a simplified interatomic force microscope (AFM) Nanopics 2100 in the following condition 3.

Condition 3

Length of measurement: 1 μm

SCAN SPEED: 1.35 μm/sec

FORCE REFARENCE: 160

A sample having a Rz of 1 nm or more and 100 nm or less was rated as ◉, a sample having a Rz exceeding 100 nm and a Rz of 1000 nm or less was rated as ○ and a sample having a Rz of less than 1 nm or a Rz exceeding 1000 nm was rated as Δ. The results are shown in Table 2.

(Test for Evaluation of the Shape of Copper Surface)

The surface shape of the surface-treated side of each electrolytic foil manufactured by Examples 15 to 28 and Comparative Examples 5 to 8 was examined. The surface shape was observed at a magnification of 100,000 by a scanning type electron microscope (S-4700, manufactured by Hitachi, Ltd.). The case where the surface shape of copper had precise and uniform irregularities was rated as ○ and otherwise rated as X. The results are shown in Table 2. With regard to Comparative Example 4, the irregularities of the surface copper could not be observed because the (step d-2) was not carried out.

(Test for Evaluation of the Glossiness of Copper Surface)

The surface of the surface-treated side of each electrolytic foil manufactured by Examples 15 to 28 and Comparative Examples 5 to 8 was observed visually to examine whether the surface had glossiness or not. A sample having no glossiness was rated as ○ and a sample having glossiness was rated as X. The results are shown in Table 2.

(Insulation Between the Wires when the Wiring is Processed by the Treatment of Copper Surface)

Four substrates for evaluation which were free from the developments of short circuit between the wires having L/S of 5/5 μm and L/S of 10/10 μm and from the braking of wire were selected from the substrates for evaluation that were described in Examples 29 to 42 and Comparative Examples 9 to 12 to measure the insulation resistance between the wires. However, with regard to the substrate for evaluation obtained in Comparative Example 11, the insulation resistance was not measured since the accuracy of the wiring could not be maintained.

First, using R-8340A-model digital high resistance microcurrent meter manufactured by Advantest Corporation, a voltage of DC 5V was applied across the L/S wires for 30 seconds to measure insulation resistance between the L/S wires. It is to be noted that a Digital Multimeter 3457A manufactured by Hewlett-Packard was used to measure an insulation resistance of 1 GΩ or less.

Next, a voltage of DC 5 V was continuously applied between the L/S wires in a thermohygrostat kept at 85° C. under a relative humidity of 85% to measure the insulation resistances between the L/S wires after 24 h, 48 h, 96 h, 200 h, 500 h and 1000 h in the same manner as above. As the thermohygrostat, EC-10HHPS model thermohydgrostat manufactured by Hitachi, Ltd. was used to measure until 1000 hours passed after the wires were placed in the thermohygrostat.

With regard to four substrates for evaluation measured in the above manner, the case where the minimum value of the insulation resistance was less than 1 GΩ was rated as X and the case where the minimum value of the insulation resistance was $1.0 \times 10^9 \Omega$ or more was rated as ○. The results are shown in Tables 4 and 5.

(Test for Evaluation of the Formation of a Resist Pattern)

The success rate of the resist pattern 119 was evaluated in the (step a') described in Examples 43 to 56 and Comparative Examples 13 to 16. In the method of evaluation, a sample in which a resist residue was not present on the place where the wiring was to be formed and no peeling of the resist was observed and in which when the width of each L/S resist was measured, a deviation of the width of each L/S resist from the design value was within ±10% was rated as a good product, to examine the ratio of the good products. The results are shown in Table 6. In this case, with regard to the substrate for evaluation obtained in Comparative 15, the copper thin film 118 disappeared when the copper surface treatment was carried out and therefore no measurement was made.

(Test for Evaluation of the Formation of Wiring)

The success rate of the wiring 106 was evaluated in the (step a') described in Examples 43 to 56 and Comparative Examples 13 to 16. In the method of evaluation, a sample which was free from the development of short circuits and breaking of wires and the deviation of the thickness of copper plating from the design value (5 μm) was within ±10% was rated as a good product, to examine the ratio of the good products. The results are shown in Table 6. In this case, with regard to the substrate for evaluation obtained in Comparative 15, the copper thin film 118 disappeared when the copper surface treatment was carried out and therefore no measurement was made.

(Test for Evaluation of PCT Resistance)

The substrates for evaluation which were described in Examples 29 to 42 and Comparative Examples 9 to 12 were subjected to a test for PCT resistance (121° C., 200 h, 0.2 MPa). In the method of evaluation, a sample which was free from swelling and peeling between the wiring 106 and the insulating layer (buildup layer) 104, between the insulating layer 104 and the insulating layer (buildup layer) 104, between the wiring 106 and the solder resist 109 and between the insulating layer 104 and the solder resist 109 after the test for PCT resistance was rated as a good product, to examine the ratio of the good products. The results are shown in Table 7. However, with regard to Comparative Example 11, a test substrate could not be produced because the formed wiring disappeared.

(Test for Evaluation as to Whether a Pink Ring Occurred or not)

Each substrate for evaluation described in Examples 57 to 70 and Comparative Examples 17 to 20 was dipped in 18% hydrochloric acid for 3 hours to examine the ratio of a ring having a pink color (pink ring) in the vicinity of the hole. The results are shown in Table 8.

(Evaluation of the Appearance of Gold Plating and the Condition of a Solder Resist)

With regard to the substrates for evaluation which were described in Examples 71 to 84 and Comparative Examples 21 to 24, the appearance of gold plating of each substrate was observed visually or by a microscope. The case where nonuniformity of gold plating was not observed was rated as ○, nonuniformity of gold plating was observed was rated as Δ and gold plating was not deposited was rated as X. As to the condition of the solder resist, a sample which was free from peeling and no deposition of gold plating under the solder resist was rated as ○ and otherwise rated as X. The results are shown in Table 9.

TABLE 1

|  | No. | Number of NG after the reflow test | Number of NG after the temperature cycle test | | |
|---|---|---|---|---|---|
|  |  |  | 500th cycle | 1,000th cycle | 1,500th cycle |
| Example | 1 | 22/22 | 22/22 | 22/22 | 22/22 |
|  | 2 | 0/22 | 0/22 | 0/22 | 0/22 |
|  | 3 | 22/22 | 22/22 | 22/22 | 22/22 |
|  | 4 | 22/22 | 22/22 | 22/22 | 22/22 |
|  | 5 | 22/22 | 22/22 | 22/22 | 22/22 |
|  | 6 | 22/22 | 22/22 | 22/22 | 22/22 |
|  | 7 | 22/22 | 22/22 | 22/22 | 22/22 |
|  | 8 | 0/22 | 0/22 | 0/22 | 0/22 |
|  | 9 | 0/22 | 0/22 | 0/22 | 0/22 |
|  | 10 | 0/22 | 0/22 | 0/22 | 0/22 |
|  | 11 | 0/22 | 0/22 | 0/22 | 0/22 |
|  | 12 | 0/22 | 0/22 | 0/22 | 0/22 |
|  | 13 | 0/22 | 0/22 | 0/22 | 0/22 |
|  | 14 | 0/22 | 0/22 | 0/22 | 0/22 |
| Comparative Example | 1 | 22/22 | 22/22 | 22/22 | 22/22 |
|  | 2 | 0/22 | 0/22 | 0/22 | 0/22 |
|  | 3 | — | — | — | — |
|  | 4 | 22/22 | 22/22 | 22/22 | 22/22 |

TABLE 2

|  | No. | Adhesiveness after allowed to stand at 150° C. (N/m) | | | Smoothness | Shape of the surface of copper | Glossiness of the surface of copper |
|---|---|---|---|---|---|---|---|
|  |  | 0 h | 120 h | 240 h |  |  |  |
| Example | 15 | ○(900) | ○(850) | ○(710) | ⊚ | ○ | ○ |
|  | 16 | ○(850) | ○(800) | ○(650) | ⊚ | ○ | ○ |
|  | 17 | ○(950) | ○(900) | ○(750) | ⊚ | ○ | ○ |
|  | 18 | ○(870) | ○(850) | ○(800) | ⊚ | ○ | ○ |
|  | 19 | ○(860) | ○(850) | ○(820) | ⊚ | ○ | ○ |
|  | 20 | ○(920) | ○(900) | ○(850) | ⊚ | ○ | ○ |
|  | 21 | ○(950) | ○(900) | ○(850) | ⊚ | ○ | ○ |
|  | 22 | ○(900) | ○(860) | ○(750) | ⊚ | ○ | ○ |
|  | 23 | ○(850) | ○(830) | ○(750) | ⊚ | ○ | ○ |
|  | 24 | ○(860) | ○(820) | ○(780) | ⊚ | ○ | ○ |
|  | 25 | ○(900) | ○(860) | ○(800) | ⊚ | ○ | ○ |
|  | 26 | ○(910) | ○(860) | ○(850) | ⊚ | ○ | ○ |

TABLE 2-continued

|  | No. | Adhesiveness after allowed to stand at 150° C. (N/m) | | | Smoothness | Shape of the surface of copper | Glossiness of the surface of copper |
|---|---|---|---|---|---|---|---|
|  |  | 0 h | 120 h | 240 h |  |  |  |
|  | 27 | ○(800) | ○(700) | ○(600) | ◎ | ○ | ○ |
|  | 28 | ○(750) | ○(600) | ○(550) | ◎ | ○ | ○ |
| Comparative Example | 5 | ○(1,100) | ○(1,000) | ○(850) | ○ | x | ○ |
|  | 6 | ○(1,050) | ○(1,000) | ○(900) | ○ | x | ○ |
|  | 7 | ○(1,200) | ○(1,050) | ○(900) | Δ | x | ○ |
|  | 8 | x(150) | x(100) | x(50) | ◎ | — | x |

TABLE 3

| | No. | Detected substance | | | | | | | | | | | | |
|---|---|---|---|---|---|---|---|---|---|---|---|---|---|---|
| | | Cation | | | | | | Anion | | | | | | Metal ion |
| | | $Li^+$ | $Na^+$ | $NH_4^+$ | $K^+$ | $Mg^{2+}$ | $Ca^{2+}$ | $Cl^-$ | $Br^-$ | $NO_2^-$ | $NO_3^-$ | $PO_4^{3-}$ | $SO_4^{2-}$ | Fe |
| Example | 15 | − | − | − | − | − | − | − | − | − | − | − | − | − |
|  | 16 | − | − | − | − | − | − | − | − | − | − | − | − | − |
|  | 17 | − | − | − | − | − | − | − | − | − | − | − | − | − |
|  | 18 | − | − | − | − | − | − | − | − | − | − | − | − | − |
|  | 19 | − | − | − | − | − | − | − | − | − | − | − | − | − |
|  | 20 | − | − | − | − | − | − | − | − | − | − | − | − | − |
|  | 21 | − | − | − | − | − | − | − | − | − | − | − | − | − |
|  | 22 | − | − | − | − | − | − | − | − | − | − | − | − | − |
|  | 23 | − | − | − | − | − | − | − | − | − | − | − | − | − |
|  | 24 | − | − | − | − | − | − | − | − | − | − | − | − | − |
|  | 25 | − | − | − | − | − | − | − | − | − | − | − | − | − |
|  | 26 | − | − | − | − | − | − | − | − | − | − | − | − | − |
|  | 27 | − | − | − | − | − | − | − | − | − | − | − | − | − |
|  | 28 | − | − | − | − | − | − | − | − | − | − | − | − | − |
| Comparative Example | 5 | − | ++ | ++ | ++ | ++ | ++ | +++ | − | ++ | ++ | ++ | +++ | ++ |
|  | 6 | − | ++ | ++ | ++ | ++ | ++ | +++ | − | ++ | ++ | ++ | +++ | ++ |
|  | 7 | − | ++ | ++ | ++ | ++ | ++ | +++ | − | ++ | ++ | ++ | +++ | ++ |
|  | 8 | − | − | − | − | − | − | − | − | − | − | − | − | − |

TABLE 4

| | No. | Insulation resistance (Ω) between L/S of 5/5 (comb type) | | | | | | |
|---|---|---|---|---|---|---|---|---|
| | | 0 h | 24 h | 48 h | 96 h | 200 h | 500 h | 1000 h |
| Example | 29 | ○ | ○ | ○ | ○ | ○ | ○ | ○ |
|  | 30 | ○ | ○ | ○ | ○ | ○ | ○ | ○ |
|  | 31 | ○ | ○ | ○ | ○ | ○ | ○ | ○ |
|  | 32 | ○ | ○ | ○ | ○ | ○ | ○ | ○ |
|  | 33 | ○ | ○ | ○ | ○ | ○ | ○ | ○ |
|  | 34 | ○ | ○ | ○ | ○ | ○ | ○ | ○ |
|  | 35 | ○ | ○ | ○ | ○ | ○ | ○ | ○ |
|  | 36 | ○ | ○ | ○ | ○ | ○ | ○ | ○ |
|  | 37 | ○ | ○ | ○ | ○ | ○ | ○ | ○ |
|  | 38 | ○ | ○ | ○ | ○ | ○ | ○ | ○ |
|  | 39 | ○ | ○ | ○ | ○ | ○ | ○ | ○ |
|  | 40 | ○ | ○ | ○ | ○ | ○ | ○ | ○ |
|  | 41 | ○ | ○ | ○ | ○ | ○ | ○ | ○ |
|  | 42 | ○ | ○ | ○ | ○ | ○ | ○ | ○ |
| Comparative Example | 9 | ○ | ○ | ○ | ○ | ○ | x | x |
|  | 10 | ○ | ○ | ○ | ○ | ○ | ○ | ○ |
|  | 11 | — | — | — | — | — | — | — |
|  | 12 | ○ | ○ | x | x | x | x | x |

TABLE 5

| | No. | Insulation resistance (Ω) between L/S of 10/10 (comb type) | | | | | | |
|---|---|---|---|---|---|---|---|---|
| | | 0 h | 24 h | 48 h | 96 h | 200 h | 500 h | 1000 h |
| Example | 29 | ○ | ○ | ○ | ○ | ○ | ○ | ○ |
|  | 30 | ○ | ○ | ○ | ○ | ○ | ○ | ○ |
|  | 31 | ○ | ○ | ○ | ○ | ○ | ○ | ○ |
|  | 32 | ○ | ○ | ○ | ○ | ○ | ○ | ○ |
|  | 33 | ○ | ○ | ○ | ○ | ○ | ○ | ○ |
|  | 34 | ○ | ○ | ○ | ○ | ○ | ○ | ○ |
|  | 35 | ○ | ○ | ○ | ○ | ○ | ○ | ○ |
|  | 36 | ○ | ○ | ○ | ○ | ○ | ○ | ○ |
|  | 37 | ○ | ○ | ○ | ○ | ○ | ○ | ○ |
|  | 38 | ○ | ○ | ○ | ○ | ○ | ○ | ○ |
|  | 39 | ○ | ○ | ○ | ○ | ○ | ○ | ○ |
|  | 40 | ○ | ○ | ○ | ○ | ○ | ○ | ○ |
|  | 41 | ○ | ○ | ○ | ○ | ○ | ○ | ○ |
|  | 42 | ○ | ○ | ○ | ○ | ○ | ○ | ○ |
| Comparative Example | 9 | ○ | ○ | ○ | ○ | ○ | ○ | x |
|  | 10 | ○ | ○ | ○ | ○ | ○ | ○ | ○ |
|  | 11 | — | — | — | — | — | — | — |
|  | 12 | ○ | ○ | ○ | ○ | x | x | x |

TABLE 6

|  | No. | Success rate of formation of a resist pattern (%) 5/5(μm) | 10/10(μm) | Success rate of formation of wiring (%) 5/5(μm) | 10/10(μm) |
|---|---|---|---|---|---|
| Example | 43 | 100 | 100 | 100 | 100 |
|  | 44 | 100 | 100 | 100 | 100 |
|  | 45 | 100 | 100 | 100 | 100 |
|  | 46 | 100 | 100 | 100 | 100 |
|  | 47 | 100 | 100 | 100 | 100 |
|  | 48 | 100 | 100 | 100 | 100 |
|  | 49 | 100 | 100 | 100 | 100 |
|  | 50 | 100 | 100 | 100 | 100 |
|  | 51 | 100 | 100 | 100 | 100 |
|  | 52 | 100 | 100 | 100 | 100 |
|  | 53 | 100 | 100 | 100 | 100 |
|  | 54 | 100 | 100 | 100 | 100 |
|  | 55 | 100 | 100 | 100 | 100 |
|  | 56 | 100 | 100 | 100 | 100 |
| Comparative Example | 13 | 80 | 90 | 50 | 60 |
|  | 14 | 85 | 95 | 60 | 75 |
|  | 15 | — | — | — | — |
|  | 16 | 50 | 90 | 40 | 80 |

TABLE 7

|  | No. | PCT resistance (%) Wiring 106 and insulating layer 104 | Insulating layer 104 and insulating layer 104 | Wiring 106 and solder resist 109 | Insulating layer 104 and solder resist 109 |
|---|---|---|---|---|---|
| Example | 29 | 100 | 100 | 100 | 100 |
|  | 30 | 100 | 100 | 100 | 100 |
|  | 31 | 100 | 100 | 100 | 100 |
|  | 32 | 100 | 100 | 100 | 100 |
|  | 33 | 100 | 100 | 100 | 100 |
|  | 34 | 100 | 100 | 100 | 100 |
|  | 35 | 100 | 100 | 100 | 100 |
|  | 36 | 100 | 100 | 100 | 100 |
|  | 37 | 100 | 100 | 100 | 100 |
|  | 38 | 100 | 100 | 100 | 100 |
|  | 39 | 100 | 100 | 100 | 100 |
|  | 40 | 100 | 100 | 100 | 100 |
|  | 41 | 100 | 100 | 100 | 100 |
|  | 42 | 100 | 100 | 100 | 100 |
| Comparative Example | 9 | 100 | 20 | 100 | 30 |
|  | 10 | 100 | 25 | 100 | 35 |
|  | 11 | — | — | — | — |
|  | 12 | 0 | 90 | 0 | 90 |

TABLE 8

|  | No. | Rate of generation of a pink ring (%) |
|---|---|---|
| Example | 57 | 100 |
|  | 58 | 0 |
|  | 59 | 100 |
|  | 60 | 100 |
|  | 61 | 100 |
|  | 62 | 100 |
|  | 63 | 100 |
|  | 64 | 0 |
|  | 65 | 0 |
|  | 66 | 0 |
|  | 67 | 0 |
|  | 68 | 0 |
|  | 69 | 0 |
|  | 70 | 0 |

TABLE 8-continued

|  | No. | Rate of generation of a pink ring (%) |
|---|---|---|
| Comparative Example | 17 | 100 |
|  | 18 | 0 |
|  | 19 | 100 |
|  | 20 | 100 |

TABLE 9

|  | No. | Appearance of gold plating | Condition of a solder resist |
|---|---|---|---|
| Example | 71 | ○ | x |
|  | 72 | ○ | ○ |
|  | 73 | ○ | x |
|  | 74 | ○ | x |
|  | 75 | ○ | x |
|  | 76 | ○ | x |
|  | 77 | ○ | x |
|  | 78 | ○ | ○ |
|  | 79 | ○ | ○ |
|  | 80 | ○ | ○ |
|  | 81 | ○ | ○ |
|  | 82 | ○ | ○ |
|  | 83 | ○ | ○ |
|  | 84 | ○ | ○ |
| Comparative Example | 21 | x | x |
|  | 22 | x | ○ |
|  | 23 | — | — |
|  | 24 | ○ | ○ |

As shown in Table 1, Examples 2 and 8 to 14 which were subjected to the reducing treatment after the oxidation treatment using an alkaline solution among the semiconductor packages manufactured in Examples 1 to 14 exhibited very high reliability.

As shown in Table 2, each of the electrolytic copper foils manufactured in Examples 15 to 28 had precise and uniform irregularities of tens nano level on its surface to thereby restrict the glossiness of the surface of copper and also, had the characteristics that the adhesive strength (peel strength) between its surface and the insulating layer after it was allowed to stand at 150° C. for 240 hour was 300 N/m or more, which was desirable. As shown in Table 3, various ions were not detected from the treated surface of the electrolytic copper foil manufactured in Examples 15 to 28 and therefore, the purity of the surface of each copper foil was regarded as good.

As shown in Tables 4 and 5, the insulation reliability between the wires in the substrate for evaluation which was manufactured in each of Examples 29 to 42 was high in any case of L/S=5/5 μm and L/S=10/10 μm. As shown in Table 6, the success rate of formation of a resist pattern in the substrate for evaluation which was manufactured in each of Examples 43 to 56 was high in any case of L/S=5/5 μm and L/S=10/10 μm. As shown in Table 6, the success rate of formation of wiring in the substrate for evaluation which was manufactured in each of Examples 43 to 56 was high in any case of L/S=5/5 μm and L/S=10/10 μm. As shown in Table 7, the PCT resistance of the substrate for evaluation manufactured in each of Examples 29 to 42 was very high in any of the boundaries between buildup layer and the wiring, between the buildup layer and the insulating layer, between the solder resist and the wiring and between the solder resist and the insulating layer.

As shown in Table 8, Examples 58 and 64 to 70 which were subjected to the reducing treatment among the substrates for evaluation which were manufactured in Examples 57 to 70 were free from the generation of a pink ring and had very good states.

As shown in Table 9, the appearance of the gold plating in the substrate for evaluation which was manufactured in each of Examples 71 to 84 was very excellent. Examples 72 and 78 to 84 which were subjected to the reducing treatment were free from peeling of the solder resist and the deposition of gold plating under the solder resist: these examples were each in very good state.

In the current technologies, on the other hand, as shown in Comparative Examples 1 to 24, not all of the characteristics including smoothness, adhesion, shape of copper surface, glossiness of copper surface, purity of copper surface, insulation reliability between the wires, formation of a resist pattern, formation of the wiring, PCT resistance and gold plating were satisfied.

Therefore, the method of treating the surface of copper according to the present invention ensures that precise and uniform fine irregularities of tens nano level can be formed on the copper surface and it is therefore possible to improve adhesive strength between the copper surface and the insulating layer. As a result, a wiring board or a substrate for mounting a semiconductor chip which is free from the generation of a pink ring and is superior in insulation reliability between wires and formation of fine wiring and further, a semiconductor package superior in reflow resistance, temperature cycle characteristics and gold plating treatment on external connecting terminals can be produced.

Although the invention has been described in its preferred form, the present invention is not limited to the above embodiment. A person having an ordinary skill in the art may practice the invention by making various modifications and variations based on the above disclosed teachings.

What is claimed is:

1. A method of treating the surface of copper, comprising the steps of:
   forming a metal nobler than copper discretely on the surface of copper; and subsequently
   oxidizing the surface of copper by using an alkaline solution containing an oxidant.

2. The method of treating the surface of copper according to claim 1, further comprising:
   carrying out one or more treatments selected from the group consisting of reducing treatment, coupling treatment and corrosion inhibitive treatment, after the step of oxidizing the surface of copper.

3. The method of treating the surface of copper according to claim 2, wherein the oxidant is one or more selected from the group consisting of a chlorate, a chlorite, a hypochlorite, a perchlorate and a peroxodisulfate.

4. The method of treating the surface of copper according to claim 2, wherein said reducing treatment is carried out to convert irregularities made of copper oxide crystals, formed by said oxidizing, to irregularities of metal copper.

5. The method of treating the surface of copper according to claim 1, wherein the oxidant is one or more selected from the group consisting of a chlorate, a chlorite, a hypochlorite, a perchlorate and a peroxodisulfate.

6. The method of treating the surface of copper according to claim 1, wherein the metal nobler than copper is a metal selected from the group consisting of gold, silver, platinum, palladium, rhodium, rhenium, ruthenium, osmium and iridium or an alloy containing said metal.

7. The method of treating the surface of copper according to claim 1, wherein the roughness Rz of the surface of copper after being treated is 1 nm or more and 1000 nm or less.

8. The method of treating the surface of copper according to claim 1, wherein said oxidizing forms precise and uniform copper oxide crystals on the surface of copper.

9. The method of treating the surface of copper according to claim 1, wherein said oxidizing forms irregularities of crystals of copper oxide on the surface of copper, amount of crystals of the copper oxide being 0.001 mg/cm$^2$ or more and 0.3 mg/cm$^2$ or less.

10. A copper obtained by a method comprising the steps of:
    forming a metal nobler than copper discretely on the surface of copper; and then
    oxidizing the surface of copper by using an alkaline solution containing an oxidant.

11. The copper according to claim 10, wherein the method further comprises, after the step of oxidizing, carrying out one or more treatments selected from the group consisting of reducing treatment, coupling treatment and corrosion inhibitive treatment.

12. The copper according to claim 11, wherein the oxidant is one or more selected from the group consisting of a chlorate, a chlorite, a hypochlorite, a perchlorate and a peroxodisulfate.

13. The copper according to claim 11, which has been further subjected to said reducing treatment to convert irregularities made of copper oxide crystals, formed by said oxidizing, to irregularities of metal copper.

14. The copper according to claim 10, wherein the oxidant is one or more selected from the group consisting of a chlorate, a chlorite, a hypochlorite, a perchlorate and a peroxodisulfate.

15. The copper according to claim 10, wherein the metal nobler than copper is a metal selected from the group consisting of gold, silver, platinum, palladium, rhodium, rhenium, ruthenium, osmium and iridium or an alloy containing said metal.

16. The copper according to claim 10, wherein the roughness Rz of the surface of copper after being treated is 1 nm or more and 1000 nm or less.

17. The copper according to claim 10, wherein after said oxidizing the surface of the copper has precise and uniform copper oxide crystals formed thereon.

18. The copper according to claim 10, wherein after said oxidizing the surface of copper has irregularities of crystals of copper oxide formed thereon, amount of crystals of the copper oxide being 0.001 mg/cm$^2$ or more and 0.3 mg/cm$^2$ or less.

* * * * *